United States Patent
Kubota et al.

(10) Patent No.: US 9,490,646 B2
(45) Date of Patent: Nov. 8, 2016

(54) DEVICE FOR CONTROLLING ASSEMBLED BATTERY

(75) Inventors: Tomoya Kubota, Yokohama (JP);
Yasuhito Miyazaki, Yokohama (JP);
Yukinari Kato, Yokohama (JP); Yoshio Shimoida, Yokosuka (JP)

(73) Assignee: NISSAN MOTOR CO., LTD., Yokohama-Shi (JP)

( * ) Notice: Subject to any disclaimer, the term of this patent is extended or adjusted under 35 U.S.C. 154(b) by 664 days.

(21) Appl. No.: 13/885,134

(22) PCT Filed: Dec. 9, 2010

(86) PCT No.: PCT/JP2010/072074
§ 371 (c)(1),
(2), (4) Date: May 13, 2013

(87) PCT Pub. No.: WO2012/066688
PCT Pub. Date: May 24, 2012

(65) Prior Publication Data
US 2013/0234672 A1  Sep. 12, 2013

(30) Foreign Application Priority Data

Nov. 17, 2010  (JP) ................................ 2010-257194
Dec. 7, 2010   (JP) ................................ 2010-272252

(51) Int. Cl.
*H02J 7/00*  (2006.01)
*G01N 27/416*  (2006.01)
(Continued)

(52) U.S. Cl.
CPC .......... *H02J 7/007* (2013.01); *H01M 10/4207* (2013.01); *H02J 7/0016* (2013.01); *G01R 31/362* (2013.01); *G01R 31/3658* (2013.01); *Y02T 10/7055* (2013.01)

(58) Field of Classification Search
USPC ....................................................... 320/134
See application file for complete search history.

(56) References Cited

U.S. PATENT DOCUMENTS 6,366,054 B1 * 4/2002 Hoenig .............. G01R 31/3631
                                                  320/132
6,611,128 B2   8/2003 Minamiura et al.
(Continued)

FOREIGN PATENT DOCUMENTS

JP       62-100670 A    5/1987
JP     2003-204627 A    7/2003
(Continued)

OTHER PUBLICATIONS

Korean Office Action, Apr. 14, 2014, 4 pages.

*Primary Examiner* — Richard Isla Rodas
*Assistant Examiner* — David V Henze-Gongola
(74) *Attorney, Agent, or Firm* — Foley & Lardner LLP

(57) ABSTRACT

In a device for controlling an assembled battery provided with a plurality of single batteries, the device includes a capacity adjustment section for adjusting a capacity such that voltages of the single batteries are equalized at a targeted voltage, an internal state detection section for detecting terminal voltages or SOC of the single batteries and for detecting, based on the detected terminal voltages/SOC, a voltage/SOC difference among the single batteries as voltage-difference/SOC-difference data, and a time-series data storage for storing the voltage-difference/SOC-difference data in time-series. Also provided is a prediction section for more appropriately predicting time when the assembled battery becomes an abnormal state, based on a time-dependent change in the voltage-difference/SOC-difference data detected in a voltage/SOC region different from the targeted voltage by a predetermined voltage, among the stored time-series voltage-difference/SOC-difference data.

32 Claims, 15 Drawing Sheets

(51) Int. Cl.
*H01M 10/42* (2006.01)
*G01R 31/36* (2006.01)

(56) References Cited

U.S. PATENT DOCUMENTS

| | | |
|---|---|---|
| 6,759,832 B2 | 7/2004 | Minamiura et al. |
| 7,557,584 B2 | 7/2009 | Murakami et al. |
| 7,728,598 B2 | 6/2010 | Murakami et al. |
| 8,129,944 B2 | 3/2012 | Izumi et al. |
| 2003/0052646 A1 | 3/2003 | Minamiura et al. |
| 2004/0257042 A1* | 12/2004 | Liu .................... H01M 10/441 320/130 |
| 2005/0212482 A1* | 9/2005 | Nakada ................ H02J 7/0016 320/120 |
| 2009/0130542 A1* | 5/2009 | Mizoguchi ........ H01M 10/4207 429/61 |
| 2009/0243548 A1* | 10/2009 | Hoff ...................... H02J 7/0081 320/150 |
| 2010/0057385 A1 | 3/2010 | Iida |

FOREIGN PATENT DOCUMENTS

| | | |
|---|---|---|
| JP | 2008-134060 A | 6/2008 |
| KR | 10-2006-0039445 A | 5/2006 |
| KR | 10-2009-0117838 A | 11/2009 |

* cited by examiner

US 9,490,646 B2

DEVICE FOR CONTROLLING ASSEMBLED BATTERY

TECHNICAL FIELD

The present invention relates to a device for controlling an assembled battery provided with a plurality of single batteries.

BACKGROUND ART

Regarding an assembled battery provided with a plurality of single batteries, technologies to perform a capacity adjustment of the plurality of single batteries constructing the assembled battery are generally known. For example, Patent document 1 proposes a technology for detecting that the assembled battery is in a state substantially corresponding to an abnormal state when a time interval, during which a capacity adjustment is executed, becomes less than or equal to a predetermined threshold value.

However, in the above-mentioned prior art, in order to detect such an abnormal state of the assembled battery, the time interval, during which the capacity adjustment is executed, has to become less than or equal to the predetermined threshold value. This leads to the problem of a long time needed to detect that the assembled battery is in a state substantially corresponding to an abnormal state. Also, this leads to another problem that it is possible to detect the assembled battery being in a state substantially corresponding to an abnormal state, but it is impossible to predict time when the assembled battery becomes an abnormal state.

A task to be solved by the invention is to appropriately predict time when an assembled battery provided with a plurality of single batteries becomes an abnormal state.

CITATION LIST

Patent Literature

Patent document 1: Japanese patent provisional publication No. 2008-134060 (A)

SUMMARY OF INVENTION

By the invention, the aforementioned task is solved by predicting time when an assembled battery becomes an abnormal state, based on a time-dependent change in voltage-difference data detected in a voltage region different from a targeted voltage, needed to equalize voltages of a plurality of single batteries constructing the assembled battery, by a predetermined voltage or more, or based on a time-dependent change in SOC-difference data detected in a SOC region corresponding to the voltage region.

According to the invention, it is possible to more precisely grasp the tendency of a change in voltage difference or a change in SOC difference, and whereby it is possible to appropriately predict time when the assembled battery becomes an abnormal state.

DESCRIPTION OF EMBODIMENTS

The embodiments according to the invention are hereinafter explained by reference to the drawings.

First Embodiment

Figure 1:
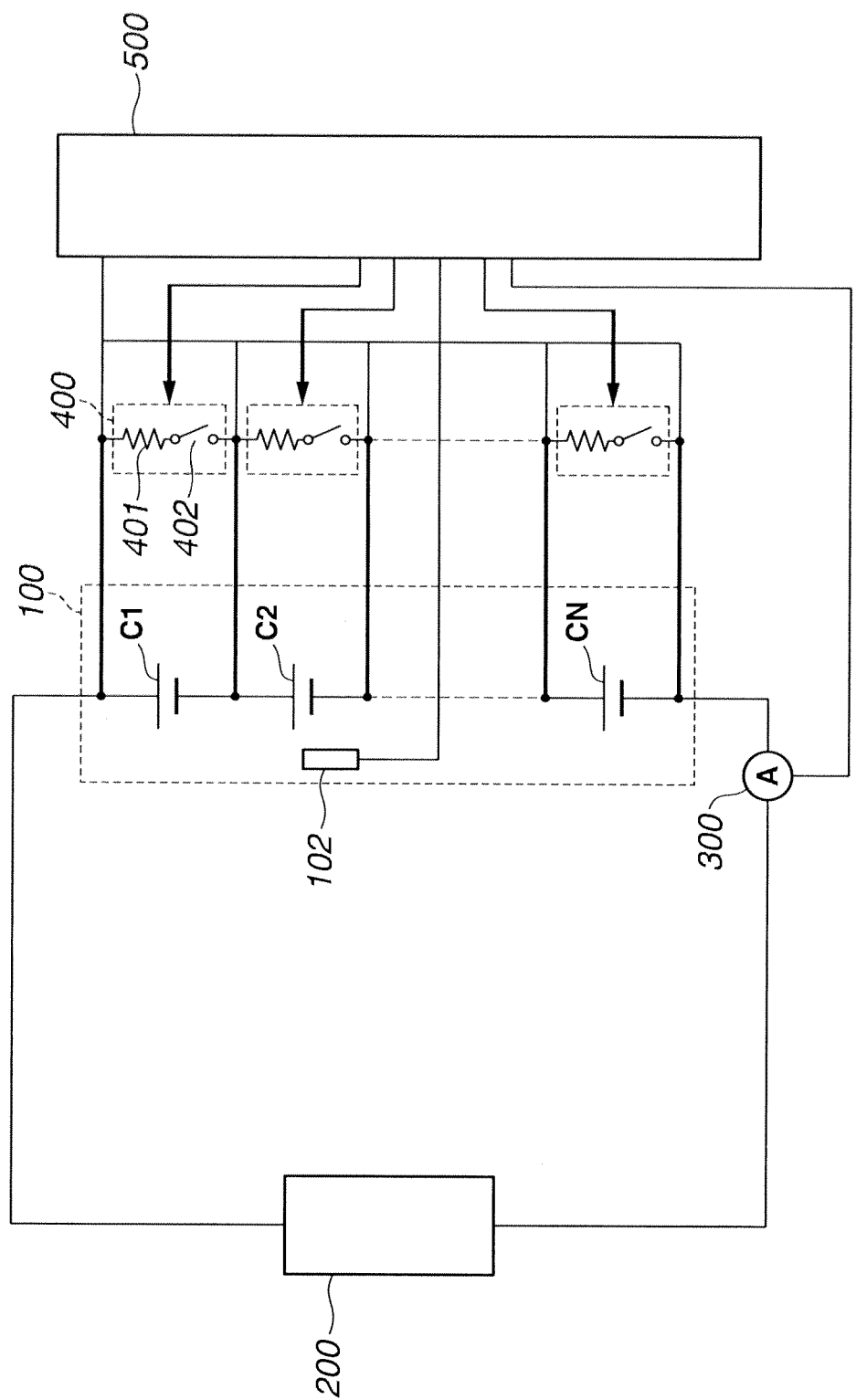
FIG. 1 is a system diagram illustrating an assembled battery system according to the invention.

FIG. 1 is the system diagram illustrating an assembled battery system of the embodiment. The assembled battery system of the embodiment is hereunder exemplified in a battery for use in an automotive vehicle such as a hybrid vehicle, an electric vehicle or the like.

As shown in FIG. 1, the assembled battery system of the embodiment is comprised of an assembled battery 100 provided with a plurality of single batteries C1, C2, ..., CN, connected in series with each other, a load 200 electrically connected to both ends of the assembled battery 100, capacity adjustment circuits 400 for adjusting a capacity of the assembled battery 100, and a battery controller 500 for controlling the whole assembled battery system.

Assembled battery 10 is constructed by connecting single batteries C1, C2, ..., CN, whose number N is an integer, in series. An alkaline storage battery such as a nickel-hydrogen battery cell or an organic electrolyte secondary battery such as a lithium-ion battery cell can be used as each single battery C1, C2, ..., CN. In the shown embodiment, a lithium-ion battery cell is used or exemplified as each of the single batteries C1, C2, ..., CN. As each of the single batteries C1, C2, ..., CN, a plurality of battery cells, which are connected in parallel and regarded as a single battery, and whose measurable terminal voltage becomes the same, may be included. By the way, the number N of the single batteries is not limited. As necessary, the number of the single batteries can be set suitably. The assembled battery 100 is also equipped with a temperature sensor 102 for measuring a temperature of the single batteries C1, C2, ..., CN. A battery temperature, measured by the temperature sensor 102, is sent to the battery controller 500.

Capacity adjustment circuits 400 are parallel-connected with the respective single batteries C1, C2, ..., CN, constructing the assembled battery 100. Each of the capacity adjustment circuits 400 is comprised of an electric resistance 401 and a switch 402, and configured to enable the single-battery capacity adjustment by performing the capacity-adjustment discharge for the single battery by closing the associated switch 402. Opening/closing action of each of the switches 402 is controlled by the battery controller 500.

Load 200 is a motor and an inverter, which are mounted on a hybrid vehicle, an electric vehicle or the like. For instance, when executing regenerative control, the assembled battery 100 can be charged by inverse transformation to electric energy via the motor and the inverter. Also, the assembled battery 100 can be charged by connecting it to an external power source (not shown).

Figure 2:
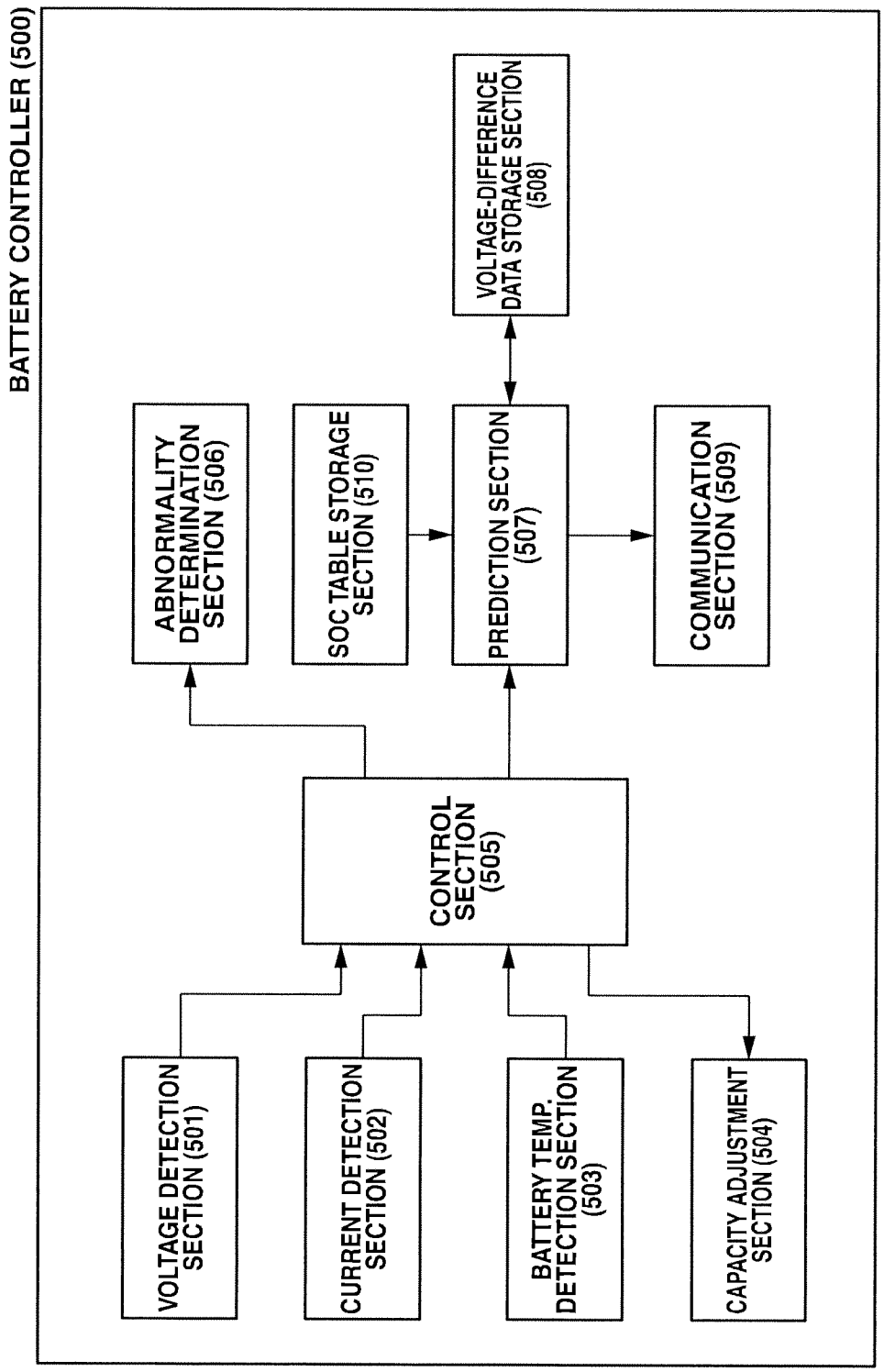
FIG. 2 is a functional block diagram illustrating a battery controller 500.

FIG. 2 is the functional block diagram illustrating the battery controller 500. As shown in FIG. 2, the battery controller 500 is comprised of a voltage detection section 501, an electric-current detection section 502, a battery temperature detection section 503, a capacity adjustment section 504, a control section 505, an abnormality determination section 506, a prediction section 507, a voltage-difference data storage section 508, a communication section 509, and a SOC table storage section 510.

Voltage detection section 501 measures a terminal voltage of each of the single batteries C1, C2, ..., CN, constructing the assembled battery 100, in time-series periodically at predetermined time intervals, via a plurality of terminal lines connected to the respective single batteries, and converts the measured terminal voltage of each of the single batteries from an analogue signal to a digital signal, and sends the converted signal to the control section 505. For instance, a method for measuring the terminal voltage of each of the single batteries includes a flying-capacitor method.

Current detection section 502 acquires a charge/discharge current, measured by a current sensor 300 periodically at predetermined time intervals, and converts the acquired charge/discharge current from an analogue signal to a digital signal, and sends the converted signal to the control section 505. For instance, the current sensor 300 can be constructed by a resistive element, a current transformer, or the like.

Battery temperature detection section 503 acquires the temperature of each single battery C1, C2, ..., CN, measured by the temperature sensor 102 installed on the assembled battery 100 periodically at predetermined time intervals, and converts the acquired temperature of each of the single batteries C1, C2, ..., CN from an analogue signal to a digital signal, and sends the converted signal to the control section 505.

Capacity adjustment section 504 controls, responsively to a capacity-adjustment command from the control section 505, opening/closing action of each of the switches 402 disposed in the respective capacity adjustment circuits 400 when a terminal voltage difference among the single batteries C1, C2, ..., CN becomes greater than or equal to a predetermined value, thereby performing the capacity adjustment of the assembled battery 100.

Control section 505 carries out a control by which the capacity adjustment is performed by means of the capacity adjustment section 504, on the basis of the data indicating the terminal voltage of each of the single batteries, the charge/discharge current, and the battery temperature, respectively received from the voltage detection section 501, the current detection section 502, and the battery temperature detection section 503. Concretely, the control section 505 sets, first of all, a targeted equalization voltage $V_{tar}$, needed to equalize voltages of the single batteries C1, C2, ..., CN, constructing the assembled battery 100. By the way, the targeted equalization voltage $V_{tar}$ is not limited. The targeted equalization voltage can be arbitrarily set. For instance, a given voltage, substantially corresponding to the assembled battery 100 fully charged, can be set as the targeted equalization voltage $V_{tar}$. In lieu thereof, a predefined voltage, such as a full-charge voltage or a given voltage near the full-charge voltage, may be preset as the targeted equalization voltage $V_{tar}$. The targeted equalization voltage $V_{tar}$, set as discussed above, is stored in a memory (not shown) incorporated in the battery controller 500. Thereafter, the control section 505 finds a maximum voltage value and a minimum voltage value from the terminal voltages of the single batteries C1, C2, ..., CN, and then calculates a voltage difference between the maximum voltage value and the minimum voltage value. When a predetermined amount of voltage difference has occurred, the control section generates a capacity-adjustment command for executing a control such that voltages of the single batteries C1, C2, ..., CN, constructing the assembled battery 100, are equalized at the targeted equalization voltage $V_{tar}$ by means of the capacity adjustment section 504. The control section sends the generated capacity-adjustment command to the capacity adjustment section 504.

Then, the capacity adjustment section 504 performs a capacity adjustment responsively to the capacity-adjustment command. Concretely, the capacity adjustment section 504 performs the capacity adjustment by controlling, responsively to the capacity-adjustment command, opening/closing action of each of the switches 402 and by executing a control such that voltages of the single batteries C1, C2, ..., CN are equalized at the targeted equalization voltage $V_{tar}$. In lieu thereof, the capacity adjustment section 504 may perform a capacity adjustment so that voltages of the single batteries C1, C2, ..., CN are adjusted to respective given voltages by controlling, responsively to the capacity-adjustment command, opening/closing action of each of the switches 402, and thereafter execute a control such that voltages of the single batteries C1, C2, ..., CN are equalized at the targeted equalization voltage $V_{tar}$ by repeated executions of charging/discharging actions in the assembled battery 100.

Control section 505 is also configured to send the data indicating the terminal voltage of each of the single batteries, the charge/discharge current, and the battery temperature, respectively received from the voltage detection section 501, the current detection section 502, and the battery temperature detection section 503 to both the abnormality determination section 506 and the prediction section 507.

Abnormality determination section 506 determines whether the assembled battery 100 is in an abnormal state (i.e., a state where use restrictions are required), using the data indicating the terminal voltage of each of the single batteries, the charge/discharge current, and the battery temperature, and sent from the control section 505. In the embodiment, a method for determining whether the assembled battery is in an abnormal state is not limited. A well-known method can be used. For instance, absolute values of electric currents charged/discharged in the assembled battery 100 before a given time has expired are integrated or summed, and then the summed value (the total charging/discharging capacity) is acquired as an abnormality criterion value. It is possible to determine an abnormality by determining whether the acquired abnormality criterion value is greater than or equal to a predetermined threshold value.

Prediction section 507 executes abnormality-time prediction processing for predicting, on the basis of the data indicating the terminal voltage of each of the single batteries, the charge/discharge current, and the battery temperature, and sent from the control section 505, time when the assembled battery 100 becomes an abnormal state. Concretely, the prediction section 507 detects the highest voltage $V_{max}$ of the single battery whose terminal voltage becomes the maximum value of the terminal voltages of the single batteries C1, C2, . . . , CN and the lowest voltage $V_{min}$ of the single battery whose terminal voltage becomes the minimum value of the terminal voltages of the single batteries. The prediction section calculates a voltage difference $\Delta V$ between the highest voltage and the lowest voltage, and executes the abnormality-time prediction processing for predicting time when the assembled battery 100 becomes an abnormal state, using the calculated voltage difference $\Delta V$, and then sends the obtained prediction result to the communication section 509. Details of the abnormality-time prediction processing of the embodiment are described later. In the embodiment, in predicting time when the assembled battery 100 becomes an abnormal state, for instance, a point of time of the occurrence of a state where use restrictions are required due to a battery capacity fall in one battery, or two or more batteries of the single batteries constructing the assembled battery 100 is utilized as the time when the abnormal state occurs.

Voltage-difference data storage section 508 allows voltage-difference $\Delta V$ data, calculated by the prediction section 507, to be stored in the memory (not shown) incorporated in the battery controller 500.

Figure 3:
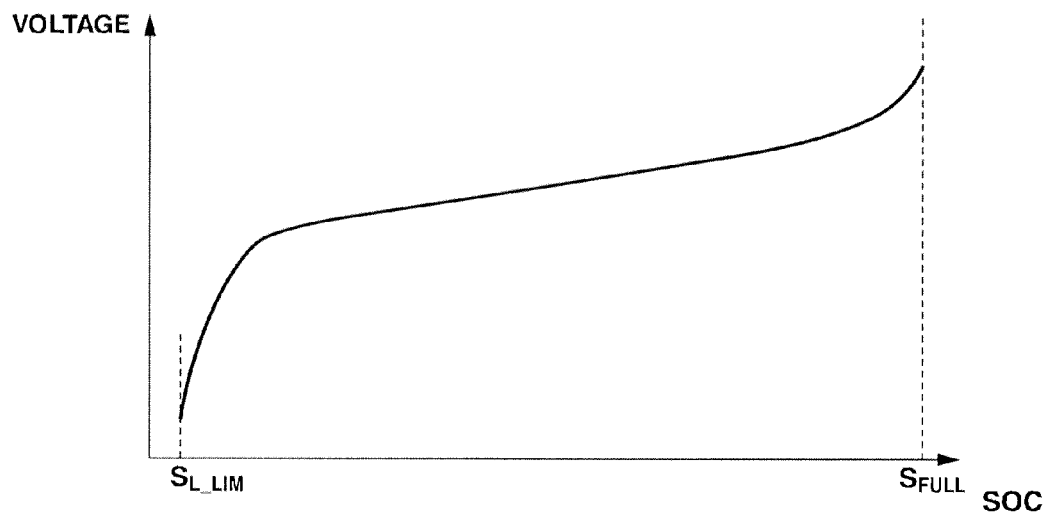
FIG. 3 is a table illustrating the relationship between a state of charge (SOC) and a terminal voltage of a lithium-ion battery, which battery is exemplified as one example of a single battery.

Referring now to FIG. 3, there is shown the table illustrating the relationship between a SOC and a terminal voltage of a lithium-ion battery exemplified as one example of each of the single batteries C1, C2, . . . , CN. The table is stored in the SOC table storage section 510. As shown in FIG. 3, the lithium-ion battery has a property that a ratio of a terminal-voltage change with respect to a SOC change in the battery becomes large in a SOC region near a full charge $S_{FULL}$ and in a SOC region near a discharge lower limit $S_{L\_LIM}$, and becomes small in the other SOC region.

Figure 4:
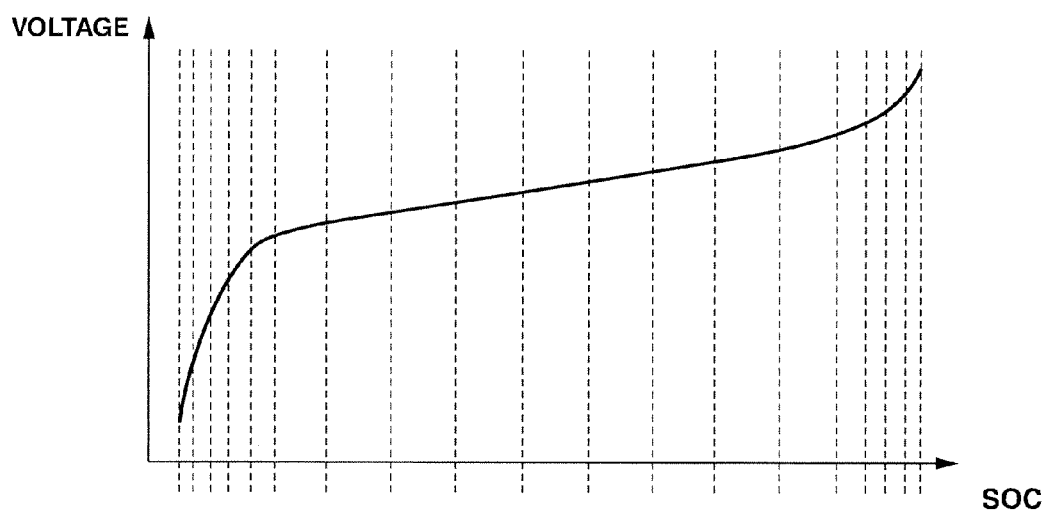
FIG. 4 is a diagram showing one example of a SOC-section table illustrating the relationship between the states of battery charge (SOC) and SOC sections $S_{sec}$.

On the other hand, in the embodiment, as shown in FIG. 4, the entire SOC range from the full charge $S_{FULL}$ to the discharge lower limit $S_{L\_LIM}$, is classified into a plurality of SOC sections $S_{sec}$. Also, a SOC-section table, illustrating the relationship between such SOC and SOC sections $S_{sec}$, is predefined, and the SOC-section table is pre-stored in the voltage-difference data storage section 508. In FIG. 4, SOC ranges, sectioned by the broken lines correspond to the respective SOC sections $S_{sec}$. Additionally, in the embodiment, as shown in FIG. 4, regarding the SOC regions in which the ratio of the terminal-voltage change with respect to the SOC change in the battery becomes large, the SOC range, constructing each of the SOC sections $S_{sec}$, is set to be narrowed, as the ratio increases. Conversely, regarding the SOC region in which the ratio of the terminal-voltage change with respect to the SOC change in the battery becomes small, the SOC range, constructing each of the SOC sections $S_{sec}$, is set to be widened, as the ratio decreases.

In the embodiment, when storing voltage-difference $\Delta V$ data, calculated by the prediction section 507, in the memory incorporated in the battery controller 500, the voltage-difference data storage section 508 determines, by reference to the SOC-section table illustrating the specified relationship shown in FIG. 4, a SOC section $S_{sec}$, to which a SOC region, corresponding to each of voltages of the plurality of single batteries C1, C2, . . . , CN (or the assembled battery 100) when arithmetic calculation for the voltage-difference $\Delta V$ data has been executed, belongs. Then, the voltage-difference data storage section 508 stores the voltage-difference $\Delta V$ data, calculated by the prediction section 507, in the memory incorporated in the battery controller 500, while correlating with the determined SOC section $S_{sec}$.

Communication section 509 sends the prediction result of the time when the assembled battery 100 becomes an abnormal state, which result has been obtained by the abnormality-time prediction processing executed within the prediction section 507, to a wireless communication terminal such as a cellular phone that the user has, or an on-vehicle equipment installed on the vehicle, for informing the user about the prediction result via the wireless communication terminal or the on-vehicle equipment.

Figure 5:
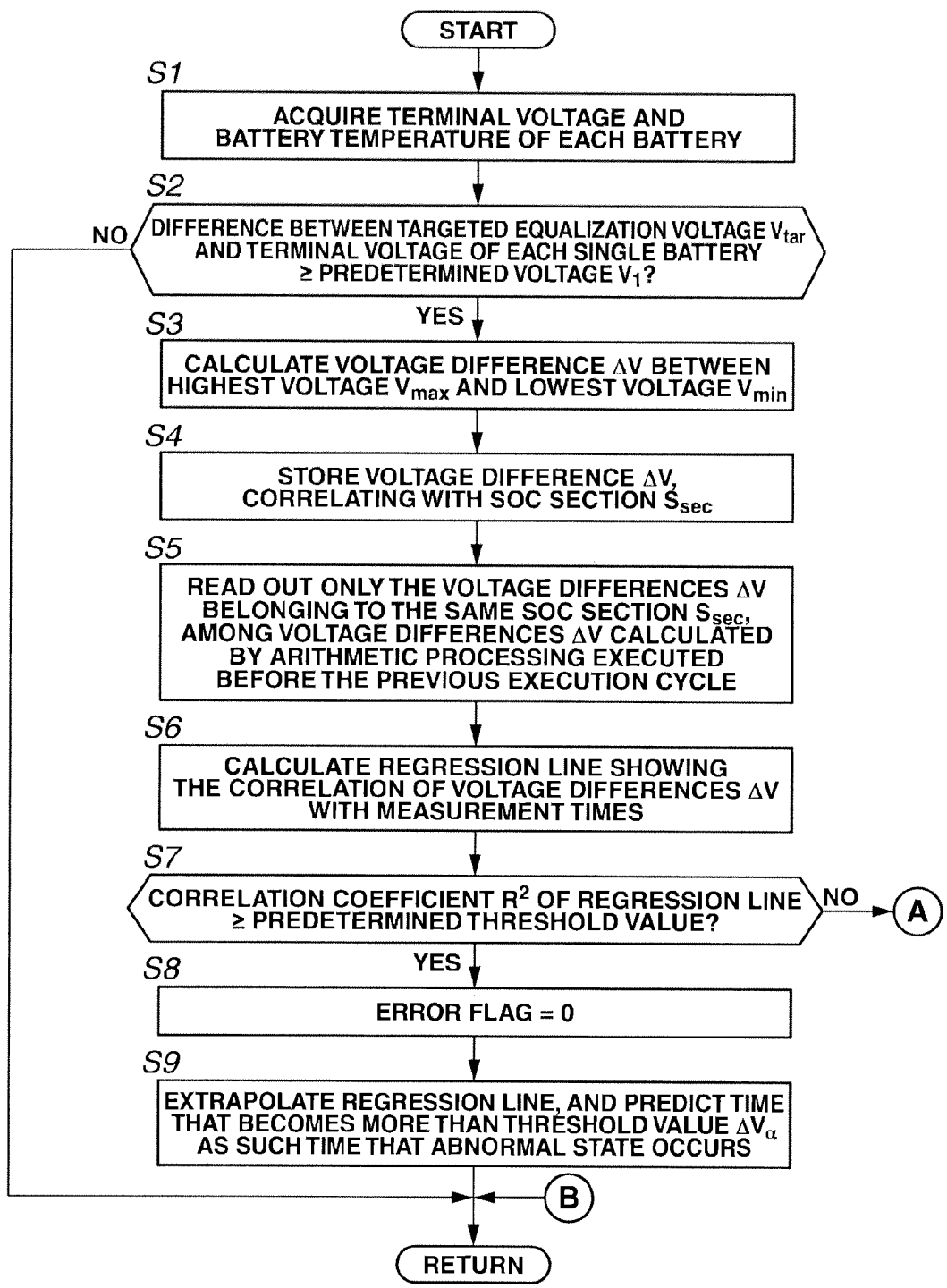
FIG. 5 is one side of a flowchart illustrating a flow of abnormality-time prediction processing according to a first embodiment.
Figure 6:
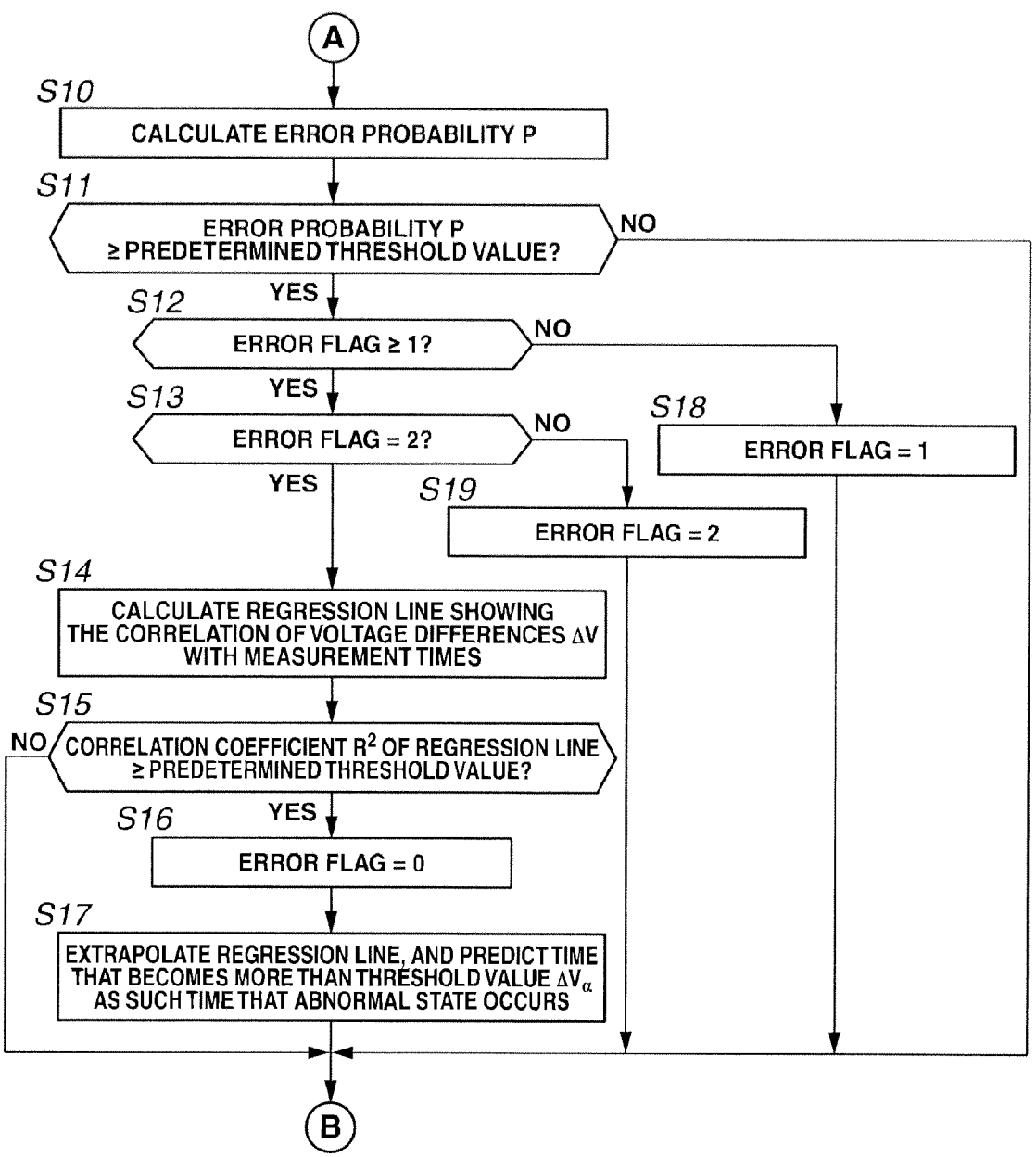
FIG. 6 is the other of the flowchart illustrating the flow of the abnormality-time prediction processing according to the first embodiment.

Then, the abnormality-time prediction processing of the embodiment, executed within the prediction section 507 of the battery controller 500, is described in detail. FIGS. 5 and 6 are the flowchart illustrating the flow of abnormality-time prediction processing of the embodiment. The abnormality-time prediction processing, hereinafter described in detail, is initiated when turning on an ignition switch of the vehicle, on which the assembled battery system of the embodiment is mounted, or when powering the vehicle's electrical systems by the charging-on system. The following processing is executed mainly by means of the prediction section 507 of the battery controller 500.

First, at step S1, data acquisition for the terminal voltage of each of the single batteries C1, C2, . . . , CN, and the battery temperature is executed.

Then, at step S2, the targeted equalization voltage $V_{tar}$, set by the control section 505, is compared to the terminal voltage of each of the single batteries C1, C2, . . . , CN, so as to determine whether the difference between the targeted equalization voltage $V_{tar}$ and the terminal voltage of each of the single batteries C1, C2, . . . , CN is greater than or equal to a predetermined voltage $V_1$. When the difference between them is greater than or equal to the predetermined voltage $V_1$, the routine proceeds to step S3. Conversely when the difference between them is less than the predetermined voltage $V_{11}$ the current processing terminates and thus the routine returns again to step S1. By the way, in the embodiment, in determining about whether the difference between the targeted equalization voltage $V_{tar}$ and the terminal voltage of each of the single batteries C1, C2, . . . , CN is greater than or equal to the predetermined voltage $V_1$, an affirmative determination that the difference between them is greater than or equal to the predetermined voltage $V_1$ can be made when the terminal voltages of all of the single batteries C1, C2, . . . , CN differ from the targeted equalization voltage $V_{tar}$ by the predetermined voltage $V_1$ or more. However, such a determination is not limited to such a condition. For instance, when the terminal voltage of each of the single batteries more than a predetermined number, among the single batteries C1, C2, . . . , CN, differs from the targeted equalization voltage $V_{tar}$ by the predetermined voltage $V_1$ or more, such a determination that the difference between them is greater than or equal to the predetermined voltage $V_1$ may be made. Also, the predetermined voltage $V_1$ is not limited. The predetermined voltage may be set to an arbitrary voltage at which it can be determined that the targeted equalization voltage $V_{tar}$ and the terminal voltage of each of the single batteries C1, C2, . . . , CN substantially differ from each other. For instance, the predetermined voltage can be set to a voltage value within a voltage range from 1 millivolt to dozens of millivolts.

Then, at step S3, the voltage difference $\Delta V$, corresponding to a finite difference among the terminal voltages of the single batteries C1, C2, . . . , CN, is calculated. Concretely, on the basis of the terminal voltage of each of the single batteries C1, C2, . . . , CN, acquired at step S1, detection processing is carried out for detecting both the highest voltage $V_{max}$ of the single battery whose terminal voltage becomes the maximum value and the lowest voltage $V_{min}$ of the single battery whose terminal voltage becomes the minimum value. Thereafter, the voltage difference $\Delta V$ is calculated by arithmetically calculating the difference between the highest voltage $V_{max}$ and the lowest voltage $V_{min}$. Then, the calculated voltage-difference $\Delta V$ data is sent to the voltage-difference data storage section 508.

Then, at step S4, the voltage-difference data storage section 508 of the battery controller 500 determines a SOC section $S_{sec}$, to which a SOC region, corresponding to the terminal voltage of each of the single batteries C1, C2, . . . , CN when arithmetic calculation for the voltage-difference $\Delta V$ data has been executed, belongs, from the voltage-difference $\Delta V$ data calculated at step S3 by reference to the SOC-section table illustrating the specified relationship shown in FIG. 4. Then, the voltage-difference data storage section 508 stores the voltage-difference $\Delta V$ data in the memory incorporated in the battery controller 500, while correlating with the determined SOC section $S_{sec}$. At this time, the voltage-difference $\Delta V$ data, together with the measurement-time data for the terminal voltage of each of the single batteries C1, C2, . . . , CN, used for arithmetic calculation for the voltage difference $\Delta V$, is stored in the memory incorporated in the battery controller 500, while correlating with the determined SOC section $S_{sec}$.

Then, at step S5, the voltage-difference $\Delta V$ data, stored in the memory and calculated by the arithmetic processing executed before the previous execution cycle, is read out. By the way, in the embodiment, when reading out the voltage-difference $\Delta V$ data calculated by the arithmetic processing executed before the previous execution cycle, only the voltage-difference $\Delta V$ data belonging to the same SOC section $S_{sec}$, which SOC section is determined at step S4, as the voltage difference $\Delta V$ calculated by the current arithmetic processing, is read out.

Figure 7:
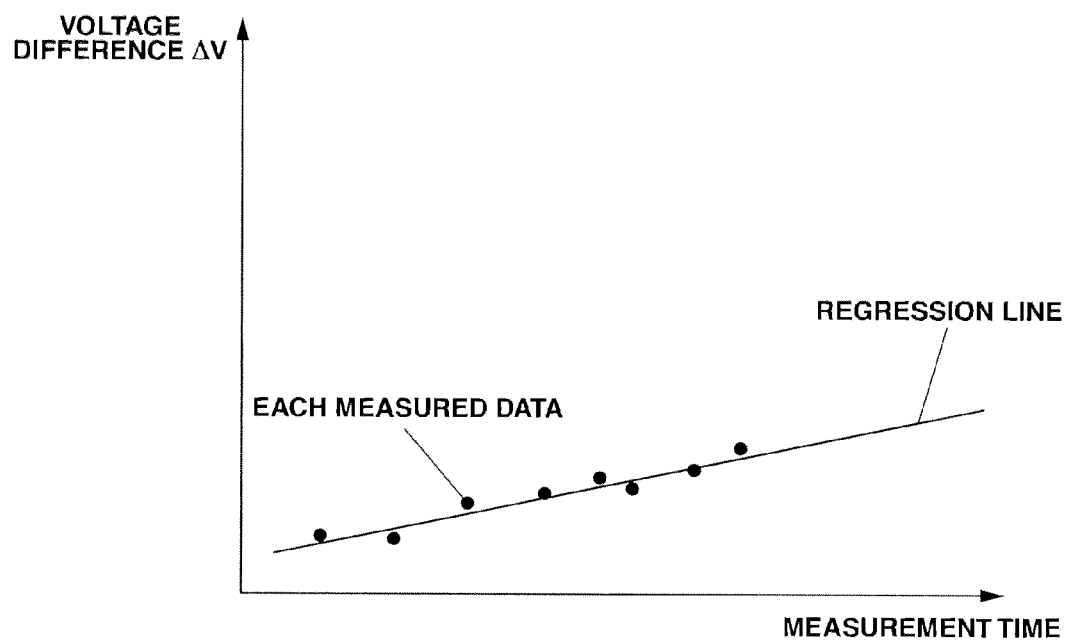
FIG. 7 is a diagram showing one example of a regression line, obtained by performing linear regression of the correlation between voltage-difference $\Delta V$ data and their measurement times.

Then, at step S6, by performing linear regression of the correlation of the voltage-difference $\Delta V$ data calculated by the arithmetic processing executed before the previous execution cycle and belonging to the same SOC section $S_{sec}$ as the voltage difference $\Delta V$ calculated by the current arithmetic processing, and the voltage-difference $\Delta V$ data calculated by the current arithmetic processing, with the measurement times of these data, a regression line is obtained. FIG. 7 shows one example of the regression line, obtained according to the embodiment. In the embodiment, as shown in FIG. 7, the measurement time is taken as an x-axis, the voltage-difference $\Delta V$ data is taken as a y-axis, and then each of the data is plotted. By performing linear regression of the plotted points, a regression line is obtained.

A method for performing linear regression is not limited. For instance, a generally-known method such as a least squares method can be used.

Then, at step S7, a correlation coefficient $R^2$ of the regression line, obtained at step S6, is calculated. On the basis of the calculated correlation coefficient $R^2$, the reliability of the regression line, obtained at step S6, is evaluated. When the correlation coefficient $R^2$ of the regression line is greater than or equal to a predetermined threshold value and thus it is determined that the reliability is enough, the routine proceeds to step S8. Conversely when the correlation coefficient $R^2$ of the regression line is less than the predetermined threshold value, the routine proceeds to step S10. By the way, the aforementioned predetermined threshold value can be set or determined depending on whether or not the reliability of the regression line is enough.

When it is determined that the reliability of the regression line, obtained at step S6, is enough, the routine proceeds to step S8. At step S8, an error flag is set to "0", and then the routine proceeds to step S9. At step S9, on the basis of the regression line obtained at step S6, processing for predicting time when the assembled battery 100 becomes an abnormal state is executed. Concretely, extrapolation processing for the regression line, obtained at step S6, is executed. Time when the voltage difference $\Delta V$ becomes greater than or equal to a predetermined threshold value $\Delta V_\alpha$ is calculated from the extrapolated regression line. The calculated time is set as the time when the assembled battery 100 becomes an abnormal state. By the way, in the embodiment, the aforementioned predetermined threshold value $\Delta V_\alpha$ can be set to an arbitrary value at which it can be determined that the assembled battery 100 becomes an abnormal state (for example, a state where use restrictions are required due to a battery capacity fall in one or two or more batteries of the single batteries constructing the assembled battery 100). Information about the time when the assembled battery 100 becomes an abnormal state, which time is predicted or obtained in this way, is sent from the prediction section 507 to the communication section 510. Then, the information is sent via the communication section 510 to the wireless communication terminal such as a cellular phone that the user has, or the on-vehicle equipment installed on the vehicle, for supplying the information about the time when the assembled battery 100 becomes an abnormal state via the wireless communication terminal or the on-vehicle equipment to the user. In this manner, by supplying the information about the time when the assembled battery 100 becomes an abnormal state to the user, the exchange of some single batteries of the single batteries constructing the assembled battery 100 can be promoted, thereby enabling the longer but safe use of the assembled battery 100 by the user.

The error flag is a flag for determining whether the voltage-difference $\Delta V$ data that an error probability P (described later) has become greater than or equal to a predetermined threshold value has occurred. In the embodiment, the error flag is set every SOC sections $S_{sec}$. That is, in the embodiment, the error flags can be set depending on the number of the SOC sections $S_{sec}$.

Conversely when step S7 determines that the correlation coefficient $R^2$ of the regression line, obtained at step S6, is less than the predetermined threshold value and thus the reliability is low, the routine proceeds to step S10. At step S10, an error probability P of the voltage-difference $\Delta V$ data calculated by the current arithmetic processing is calculated. The error probability P is actually calculated by calculating an average value $AVE(\Delta V)$ and a standard deviation $STDV(\Delta V)$ of the voltage-difference $\Delta V$ data calculated by the arithmetic processing executed before the previous execution cycle and belonging to the same SOC section $S_{sec}$ as the voltage difference $\Delta V$ calculated by the current arithmetic processing, and the voltage-difference $\Delta V$ data calculated by the current arithmetic processing, and by calculating the difference $\{\Delta V - AVE(\Delta V)\}$ between the voltage difference $\Delta V$ calculated by the current arithmetic processing and the average value $AVE(\Delta V)$, and by calculating a probability density from the difference $\{\Delta V - AVE(\Delta V)\}$ and the standard deviation $STDV(\Delta V)$.

At step S11, a check is made to determine whether the error probability P of the voltage-difference $\Delta V$ data calculated by the current arithmetic processing is greater than or equal to the predetermined threshold value. When the error probability P is greater than or equal to the predetermined threshold value, the routine proceeds to step S12. Conversely when the error probability P is less than the predetermined threshold value, the current processing terminates and thus the routine returns again to step S1. By the way, the predetermined threshold value used in step S11 is set to an arbitrary value at which it can be determined that the voltage-difference $\Delta V$ data calculated by the current arithmetic processing clearly deviates from a distribution of the voltage-difference data $\Delta V$ calculated by the arithmetic processing executed before the previous execution cycle.

At step S12, a check is made to determine whether the error flag is set to a value greater than or equal to "1". In the shown embodiment, in the case that the error probability P has been calculated by the previous arithmetic processing (see step S10) and it has been determined that the error probability P becomes greater than or equal to the predetermined threshold value (see step S11), the error flag is set to "1" at step S18 (described later). When the error flag is set to a value greater than or equal to "1", the routine proceeds to step S13. Conversely when the error flag is not set to a value greater than or equal to "1", that is, the error flag is "0", the routine proceeds to step S18. At step S18, the error flag is set to "1". Then, the current processing terminates and thus the routine returns again to step S1.

When the error flag is set to a value greater than or equal to "1", the routine proceeds to step S13, at which a check is made to determine whether the error flag is set to "2". In the shown embodiment, in the case that the error probability P has been calculated (see step S10) under such a state where the error flag has been set to "1" at the previously-discussed step S18 at the previous arithmetic processing, and it has been determined that the error probability P becomes greater than or equal to the predetermined threshold value (see step S11), the error flag is set to "2" at step S19 (described later). When the error flag is set to "2", the routine proceeds to step S14. Conversely when the error flag is not set to "2", that is, the error flag is "1", the routine proceeds to step S19, at which the error flag is set to "2". Then, the current processing terminates without predicting time when the assembled battery 100 becomes an abnormal state, and thus the routine returns again to step S1.

That is, in the embodiment, when it has been determined that, regarding the voltage-difference $\Delta V$ data belonging to the same SOC section $S_{sec}$, their error probabilities P become greater than or equal to the predetermined threshold value consecutively three times, the routine proceeds to step S14.

At step S14, a regression line showing the correlation of the voltage difference $\Delta V$ data with their measurement times is calculated in the same manner as the previously-discussed step S6, using the consecutive data for three points from the initial voltage-difference $\Delta V$ data which have been acquired consecutively three or more times.

At step S15, in the same manner as the previously-discussed step S7, a correlation coefficient $R^2$ of the regression line, obtained at step S14, is calculated. On the basis of the calculated correlation coefficient $R^2$, the reliability of the regression line, obtained at step S14, is evaluated. When the correlation coefficient $R^2$ of the regression line is greater than or equal to the predetermined threshold value and thus it is determined that the reliability is enough, the routine proceeds to step S16. Conversely when the correlation coefficient $R^2$ of the regression line is less than the predetermined threshold value, the current processing terminates and thus the routine returns again to step S1.

When it is determined that the reliability of the regression line, obtained at step S14, is enough, the routine proceeds to step S16. At step S16, the error flag is set to "0", and then the routine proceeds to step S17. At step S17, in the same manner as the previously-discussed step S9, on the basis of the regression line obtained at step S14, processing for predicting time when the assembled battery 100 becomes an abnormal state is executed. Concretely, extrapolation processing for the regression line, obtained at step S14, is executed. Time when the voltage difference $\Delta V$ becomes greater than or equal to the predetermined threshold value $\Delta V_\alpha$ is calculated from the extrapolated regression line. The calculated time is set as the time when the assembled battery 100 becomes an abnormal state. Information about the time when the assembled battery 100 becomes an abnormal state, which time is predicted or obtained in this way, is sent from the prediction section 507 to the communication section 510. Then, the information is sent via the communication section 510 to the wireless communication terminal such as a cellular phone that the user has, or the on-vehicle equipment installed on the vehicle, for supplying the information about the time when the assembled battery 100 becomes an abnormal state via the wireless communication terminal or the on-vehicle equipment to the user.

By the way, in the case that the previously-discussed processing of steps S14-S17 (hereinafter referred to as "error processing") has been executed, when, at the previously-discussed step S5 in the arithmetic processing after the next execution cycle, reading out the selected voltage-difference $\Delta V$ data of the voltage-difference $\Delta V$ data calculated by the arithmetic processing executed before the previous execution cycle, belonging to the same SOC section $S_{sec}$, while correlating with the measurement time, the voltage-difference $\Delta V$ data used by the error processing are read out. Processing for predicting time when the assembled battery 100 becomes an abnormal state is executed, using the read-out data. By the way, in the embodiment, the error flag is set every SOC sections $S_{sec}$, and the previously-discussed error processing is executed every SOC sections $S_{sec}$. Thus, in the embodiment, regarding each of the SOC sections $S_{sec}$ that the error processing has been executed, the voltage-difference $\Delta V$ data used for the error processing are read out. On the other hand, regarding each of the SOC sections $S_{sec}$ that the error processing has not yet been executed, the voltage-difference $\Delta V$ data calculated by the arithmetic processing executed before the previous execution cycle is read out as usual without reading out the voltage-difference $\Delta V$ data used for the error processing.

Also, in the case that the previously-discussed step S15 determines that the correlation coefficient $R^2$ of the regression line is less than the predetermined threshold value, when, in the processing after the next execution cycle, the error probability P is further calculated (see step S10) and then it is determined that the calculated error probability P is greater than or equal to the predetermined threshold value (see step S11), by performing linear regression of the correlation of the consecutive voltage-difference ΔV data for four points (or five points or more) in total, whose error probabilities P become greater than or equal to the predetermined threshold value, with their measurement times, in the same manner as described previously, the regression line is obtained and then the previously-discussed processing of steps S14-S17 is executed. At this time, assuming that, in the processing after the next execution cycle, a state where arithmetic processing for the error probability P is executed (see step S10) and it is determined that the calculated error probability P is greater than or equal to the predetermined threshold value (see step S11), continues, the previously-discussed processing of steps S14-S17 is repeatedly executed, until such time that step S15 has determined that the correlation coefficient $R^2$ of the regression line becomes greater than or equal to the predetermined threshold value.

In the embodiment, when voltages of single batteries C1, C2, ..., CN exist in a voltage region different from a targeted equalization voltage $V_{tar}$, needed to equalize the voltages of the single batteries C1, C2, ..., CN, a voltage difference ΔV among the single batteries C1, C2, ..., CN is calculated. Additionally, in the embodiment, by finding a time-dependent change in the calculated voltage difference ΔV, the tendency of a change in voltage difference ΔV can be grasped. Thus, according to the embodiment, it is possible to precisely grasp the tendency of a change in voltage difference ΔV. Hence, it is possible to appropriately predict time when the assembled battery 100 becomes an abnormal state (for example, a state where use restrictions are required due to a battery capacity fall in one or two or more batteries of the single batteries constructing the assembled battery 100). In particular, according to the embodiment, when the voltages of the single batteries C1, C2, ..., CN exist in the voltage region different from the targeted equalization voltage $V_{tar}$ by a predetermined voltage $V_1$ or more, the voltage difference ΔV is calculated. By executing processing for predicting time when the assembled battery 100 becomes an abnormal state, using the calculated data, it is possible to greatly reconcile the capacity adjustment and prediction for an abnormal state of the assembled battery 100. That is, according to the embodiment, it is possible to execute processing for predicting time when the assembled battery 100 becomes an abnormal state without being affected by the capacity adjustment, while appropriately executing the capacity adjustment.

Also, in the embodiment, by reference to the SOC-section table illustrating the specified relationship shown in FIG. 4, a SOC section $S_{sec}$, to which a SOC region, corresponding to each of terminal voltages of the single batteries C1, C2, ..., CN when arithmetic calculation for the voltage-difference ΔV data has been executed, belongs, is determined based on the calculated voltage-difference ΔV data. Then, in the embodiment, processing for predicting time when the assembled battery 100 becomes an abnormal state is performed by using only the voltage-difference ΔV data belonging to the determined SOC section $S_{sec}$ and by finding a time-dependent change in voltage-difference ΔV data belonging to the same SOC section $S_{sec}$. That is, in the embodiment, a time-dependent change in voltage-difference ΔV data is found every SOC sections $S_{sec}$, and whereby processing for predicting time when the assembled battery 100 becomes an abnormal state is performed. Thus, according to the embodiment, it is possible to appropriately compare voltage differences ΔV calculated every points of time by finding a time-dependent change in voltage difference ΔV, using only the voltage-difference ΔV data belonging to the same SOC section $S_{sec}$. Hence, it is possible to more precisely predict time when the assembled battery 100 becomes an abnormal state. Additionally, processing for predicting time when the assembled battery 100 becomes an abnormal state is performed by finding a time-dependent change in voltage difference ΔV every SOC sections $S_{sec}$, and thus it is possible to execute the processing for predicting time when the assembled battery 100 becomes an abnormal state, regardless of the discharged state of the assembled battery 100. Hence, it is possible to execute the processing for predicting time when the assembled battery 100 becomes an abnormal state, without being influenced by the driver's use custom for the assembled battery 100.

Furthermore, according to the embodiment, as shown in FIG. 4, regarding the SOC regions in which the ratio of the terminal-voltage change with respect to the SOC change in the battery becomes large, the SOC range, constructing each of the SOC sections $S_{sec}$, is set to be narrowed, as the ratio increases. Conversely, regarding the SOC region in which the ratio of the terminal-voltage change with respect to the SOC change in the battery becomes small, the SOC range, constructing each of the SOC sections $S_{sec}$, is set to be widened, as the ratio decreases. Hence, it is possible to more greatly enhance the accuracy of comparison of the voltage-difference ΔV data belonging to the same SOC section $S_{sec}$. As a result, it is possible to enhance the accuracy of prediction of time when the assembled battery 100 becomes an abnormal state.

Additionally, according to the embodiment, in predicting time when the assembled battery 100 becomes an abnormal state, on the basis of a regression line, obtained by performing linear regression of the correlation of voltage-difference ΔV data with voltage-difference ΔV measurement times, the time when the voltage difference ΔV becomes greater than or equal to the predetermined threshold value $ΔV_{α}$, is predicted as the time when the assembled battery 100 becomes an abnormal state. Hence, it is possible to comparatively simply but precisely predict time when the assembled battery 100 becomes an abnormal state. In particular, according to the embodiment, when the correlation coefficient $R^2$ of the regression line is greater than or equal to the predetermined threshold value and thus the reliability of the regression line is assured enough, processing for predicting time when the assembled battery 100 becomes an abnormal state is executed. Hence, it is possible to enhance the reliability of the prediction processing.

Also, according to the embodiment, in the case that the voltage difference ΔV is sharply increasing and hence the correlation coefficient $R^2$ of the regression line becomes low, the consecutive voltage-difference data for three points or more, whose error probabilities P become greater than or equal to the predetermined threshold value, are acquired and then another regression line is newly calculated. Processing for predicting time when the assembled battery 100 becomes an abnormal state is executed by the use of the newly calculated regression line. Thus, it is possible to more appropriately predict time when the assembled battery 100 becomes an abnormal state.

In the exemplified system configuration of the previously-described embodiment, voltage differences ΔV, calculated at all SOC sections $S_{sec}$ of the SOC sections $S_{sec}$ shown in FIG. 4, are stored, and processing for predicting time when the assembled battery 100 becomes an abnormal state is executed every SOC sections $S_{sec}$. In lieu thereof, only the voltage differences ΔV, calculated at some SOC sections $S_{sec}$ selected from the SOC sections $S_{sec}$ shown in FIG. 4, are stored. Then, processing for predicting time when the assembled battery 100 becomes an abnormal state may be executed for each of the selected SOC sections $S_{sec}$. Concretely, only the voltage differences ΔV, obtained at the SOC section $S_{sec}$ corresponding to the SOC region in which the ratio of the terminal-voltage change with respect to the SOC change in the battery is greater than or equal to a predetermined ratio (that is, the SOC sections $S_{sec}$ that the SOC range, constructing each of the SOC sections $S_{sec}$, is set to be narrowed) are stored. Then, processing for predicting time when the assembled battery 100 becomes an abnormal state may be executed by the use of these stored data. In particular, in the SOC region in which the ratio of the terminal-voltage change with respect to the SOC change in the battery is greater than or equal to the predetermined ratio, the voltage difference ΔV can be detected as a greater value for the same capacity difference (for example, see FIG. 10 described later), in comparison with the SOC region in which the ratio of the terminal-voltage change to the SOC change is low. Thus, in the case of the SOC region in which the ratio of the terminal-voltage change to the SOC change is high, it is possible to execute processing for predicting time when the assembled battery 100 becomes an abnormal state, with a high accuracy, in comparison with the SOC region in which the ratio of the terminal-voltage change to the SOC change is low. Hence, by adopting such a system configuration, it is possible to execute processing for predicting time when the assembled battery 100 becomes an abnormal state with a high accuracy, while ensuring a reduction in the number of data stored in the memory and a reduction of the operation load.

In this case, from a viewpoint that the previously-discussed effects can be more greatly enhanced, it is preferable to predict time when the assembled battery 100 becomes an abnormal state, using only the voltage differences ΔV obtained in the SOC section $S_{sec}$, corresponding to the SOC region in which the ratio of the terminal-voltage change to the SOC change of the battery is greater than or equal to the predetermined ratio, and different from the SOC section $S_{sec}$ belonging to the targeted equalization voltage $V_{tar}$.

Furthermore, when the SOC section $S_{sec}$, to which the targeted equalization voltage $V_{tar}$ belongs, exists in a SOC region near the full charge $S_{FULL}$, it is preferable to use only the voltage differences ΔV, obtained in the SOC section $S_{sec}$ existing in a SOC region near the discharge lower limit $S_{L\_LIM}$. Conversely when the SOC section $S_{sec}$, to which the targeted equalization voltage $V_{tar}$ belongs, exists in a SOC region near the discharge lower limit $S_{L\_LIM}$, it is preferable to use only the voltage differences ΔV, obtained in the SOC section $S_{sec}$ existing in a SOC region near the full charge $S_{FULL}$. That is, it is more preferable to detect the voltage differences ΔV in the SOC region opposite to the SOC region of the SOC section $S_{sec}$ to which the targeted equalization voltage $V_{tar}$ belongs, and to predict time when the assembled battery 100 becomes an abnormal state, by the use of the voltage differences ΔV detected in this way. In this case, the voltage difference among the single batteries whose voltages have been equalized at the targeted equalization voltage $V_{tar}$, can be fully canceled. Hence, it is possible to remarkably enhance the accuracy of prediction in predicting time when the assembled battery 100 becomes an abnormal state, while ensuring a reduction in the number of data stored in the memory and a reduction of the operation load.

Second Embodiment

Next, the second embodiment of the invention is hereunder described.

The second embodiment is similar to the first embodiment except that, in the assembled battery system shown in FIGS. 1-2, abnormality-time prediction processing is executed by a method described below.

The abnormality-time prediction processing of the second embodiment is hereinafter described.

Figure 8:
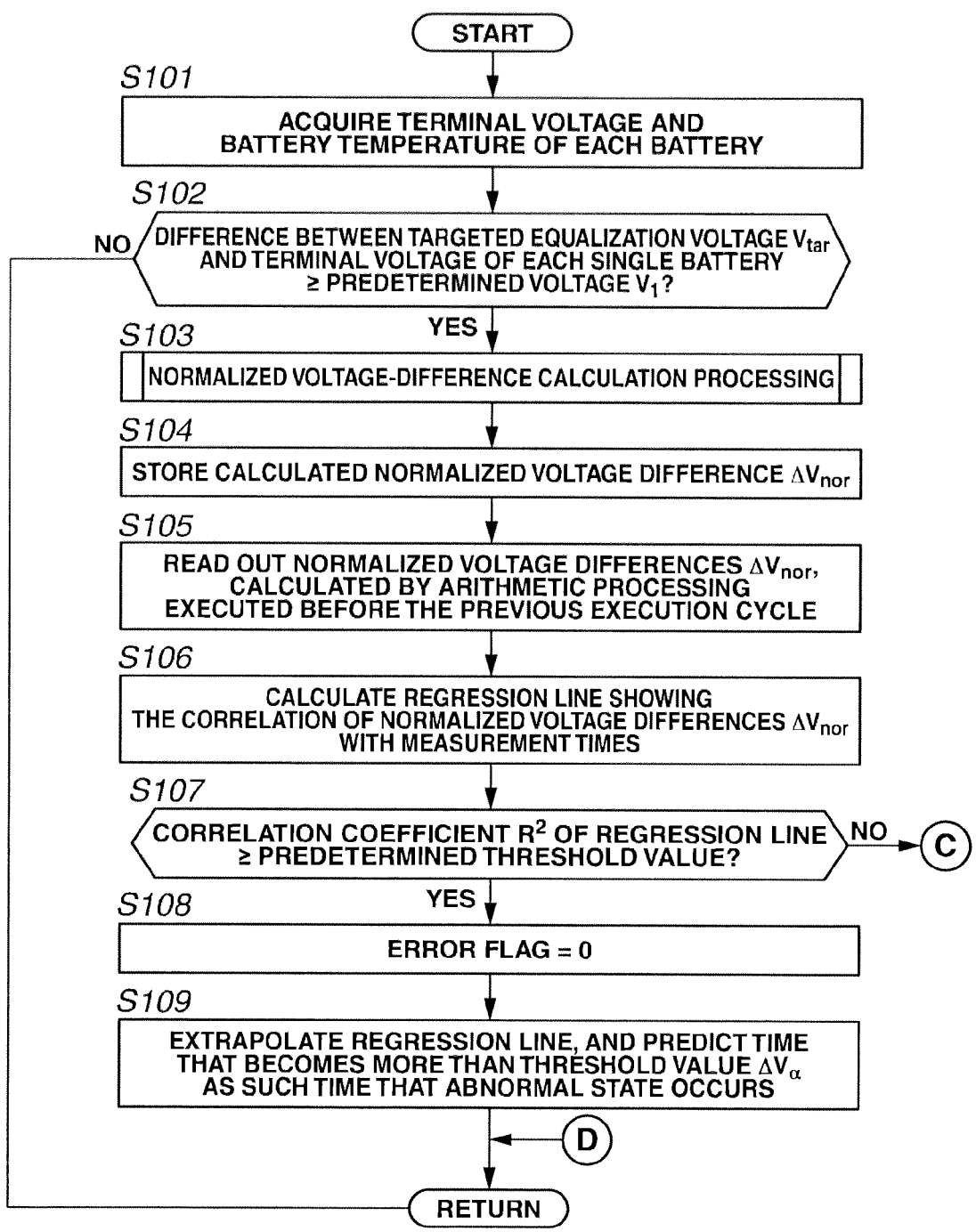
FIG. 8 is one side of a flowchart illustrating a flow of abnormality-time prediction processing according to a second embodiment.
Figure 9:
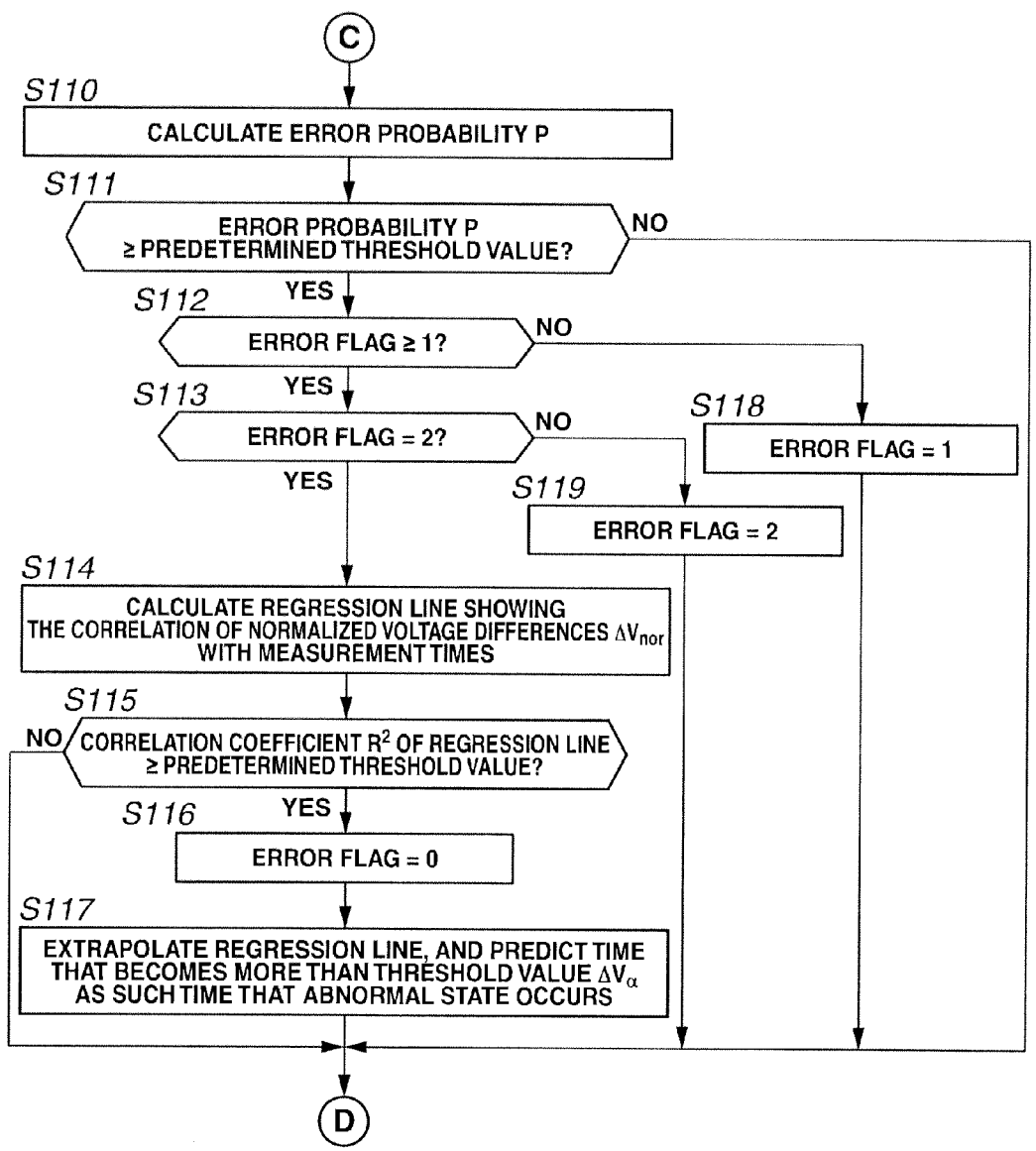
FIG. 9 is the other of the flowchart illustrating the flow of the abnormality-time prediction processing according to the second embodiment.

FIGS. 8-9 are the flowchart illustrating the flow of the abnormality-time prediction processing of the second embodiment. The abnormality-time prediction processing, hereinafter described in detail, is initiated when turning on an ignition switch of the vehicle, on which the assembled battery system of the second embodiment is mounted, or when powering the vehicle's electrical systems by the charging-on system. The following processing is executed mainly by means of the prediction section 507 of the battery controller 500.

First, at step S101, in the same manner as the previously-discussed step S1 of the first embodiment, data acquisition for the terminal voltage of each of the single batteries C1, C2, . . . , CN, and the battery temperature is executed.

Then, at step S102, in the same manner as the previously-discussed step S2 of the first embodiment, a check is made to determine whether the difference between the targeted equalization voltage $V_{tar}$ set by the control section 505 and the terminal voltage of each of the single batteries C1, C2, . . . , CN is greater than or equal to the predetermined voltage $V_1$. When the difference between them is greater than or equal to the predetermined voltage $V_1$, the routine proceeds to step S103. Conversely when the difference between them is less than the predetermined voltage $V_1$, the current processing terminates and thus the routine returns again to step S101.

Figure 10:
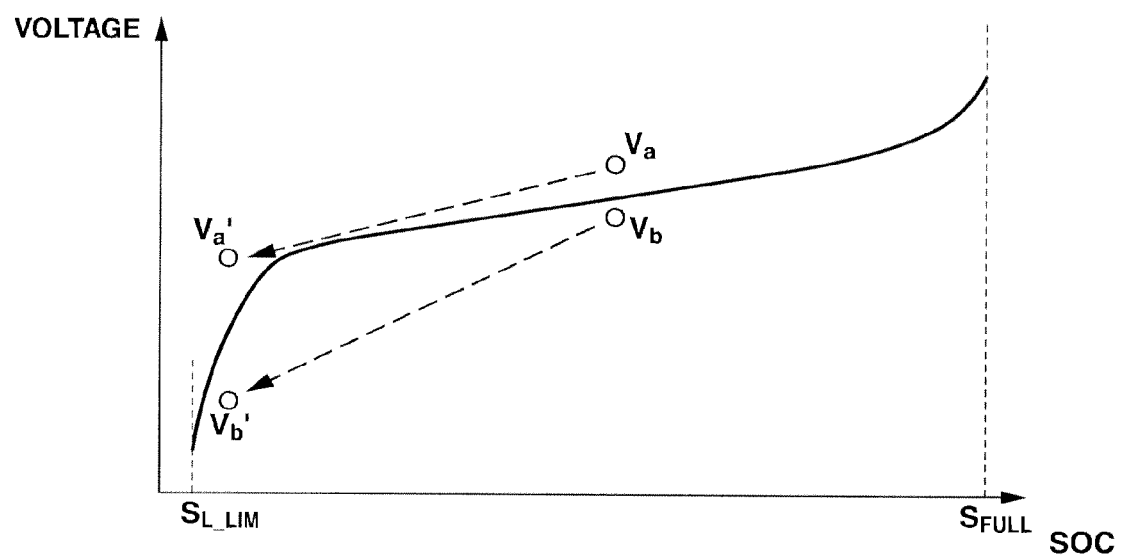
FIG. 10 is an explanatory diagram illustrating the relationship between a SOC region and a voltage difference.

Then, at step S103, the voltage difference, corresponding to a finite difference among the terminal voltages of the single batteries C1, C2, . . . , CN, is normalized with respect to a prescribed SOC, so as to execute normalized voltage-difference calculation processing. Hereupon, as shown in FIG. 3, in a lithium-ion battery cell, constructed by assembling positive-electrode materials and negative-electrode materials, and used or exemplified as each of the single batteries C1, C2, . . . , CN, has a property that a ratio of a terminal-voltage change with respect to a SOC change is not constant. Concretely, the lithium-ion battery has a property that a ratio of a terminal-voltage change with respect to a SOC change in the battery becomes large in a SOC region near a full charge $S_{FULL}$ and in a SOC region near a discharge lower limit $S_{L\_LIM}$, and becomes small in the other SOC region (i.e., a plateau region). For instance, as shown in FIG. 10, assume that the single battery A whose terminal voltage is "$V_a$" in the plateau region and the single battery B whose terminal voltage is "$V_b$" in the plateau region exist. Even when the voltage difference $(V_a-V_b)$ between them is comparatively small in the plateau region, terminal voltages of the respective single batteries become "$V_a'$" and "$V_b'$" in the SOC region near the discharge lower limit $S_{L\_LIM}$, and hence the voltage difference $(V_a'-V_b')$ between them becomes comparatively large. For the reasons discussed above, for instance, assume that two single batteries, having a certain given capacity difference ΔAh, exist. In such a case, for the same capacity difference ΔAh, the voltage difference between these two single batteries in the SOC region near the full charge $S_{FULL}$ becomes a value different from that in the plateau region. In other words, for the same voltage difference ΔV, the capacity difference, represented in the SOC region near the full charge $S_{FULL}$, tends to differ from the capacity difference represented in the plateau region. Therefore, in the second embodiment, when calculating a voltage difference among the single batteries C1, C2, . . . , CN, normalized voltage-difference calculation processing for normalizing the voltage difference with respect to a prescribed SOC (hereinafter is referred to as "prescribed $SOC_\alpha$") is executed. In this manner, the voltage difference among the single batteries C1, C2, . . . , CN, which voltage difference has been normalized with respect to the prescribed $SOC_\alpha$, is calculated as a normalized voltage difference.

By the way, the prescribed $SOC_\alpha$ is not limited but set to an arbitrary state of charge. In the shown embodiment, the prescribed $SOC_\alpha$ is set to a given SOC in SOC regions, in which a ratio of a terminal-voltage change with respect to a SOC change is large, concretely, in a SOC region near the full charge $S_{FULL}$ or in a SOC region near the discharge lower limit $S_{L\_LIM}$. By setting the prescribed $SOC_\alpha$ to a given SOC in a SOC region in which a ratio of a terminal-voltage change with respect to a SOC change is large, as can be appreciated from the diagram of FIG. 10, it is possible to calculate the obtained normalized voltage difference as a comparatively large difference. Hence, it is possible to more greatly enhance the accuracy of calculation processing when calculating a regression line of the normalized voltage difference at steps S106-S109 described later, and thus it is possible to more greatly enhance the accuracy of processing for predicting time when the assembled battery 100 becomes an abnormal state.

Additionally, the prescribed $SOC_\alpha$ can be set to a given SOC in a SOC region near the discharge lower limit $S_{L\_LIM}$ when the targeted equalization voltage $V_{tar}$ exists in a SOC region near the full charge $S_{FULL}$ and also set to a given SOC in a SOC region near the full charge $S_{FULL}$ when the targeted equalization voltage $V_{tar}$ exists in a SOC region near the discharge lower limit $S_{L\_LIM}$. That is, the prescribed $SOC_\alpha$ can be set to a given SOC of the SOC region opposite to the SOC region of the targeted equalization voltage $V_{tar}$.

A calculation processing method for the normalized voltage difference among the single batteries C1, C2, . . . , CN is hereinafter described by reference to the flowchart shown in FIG. 11.

Figure 11:
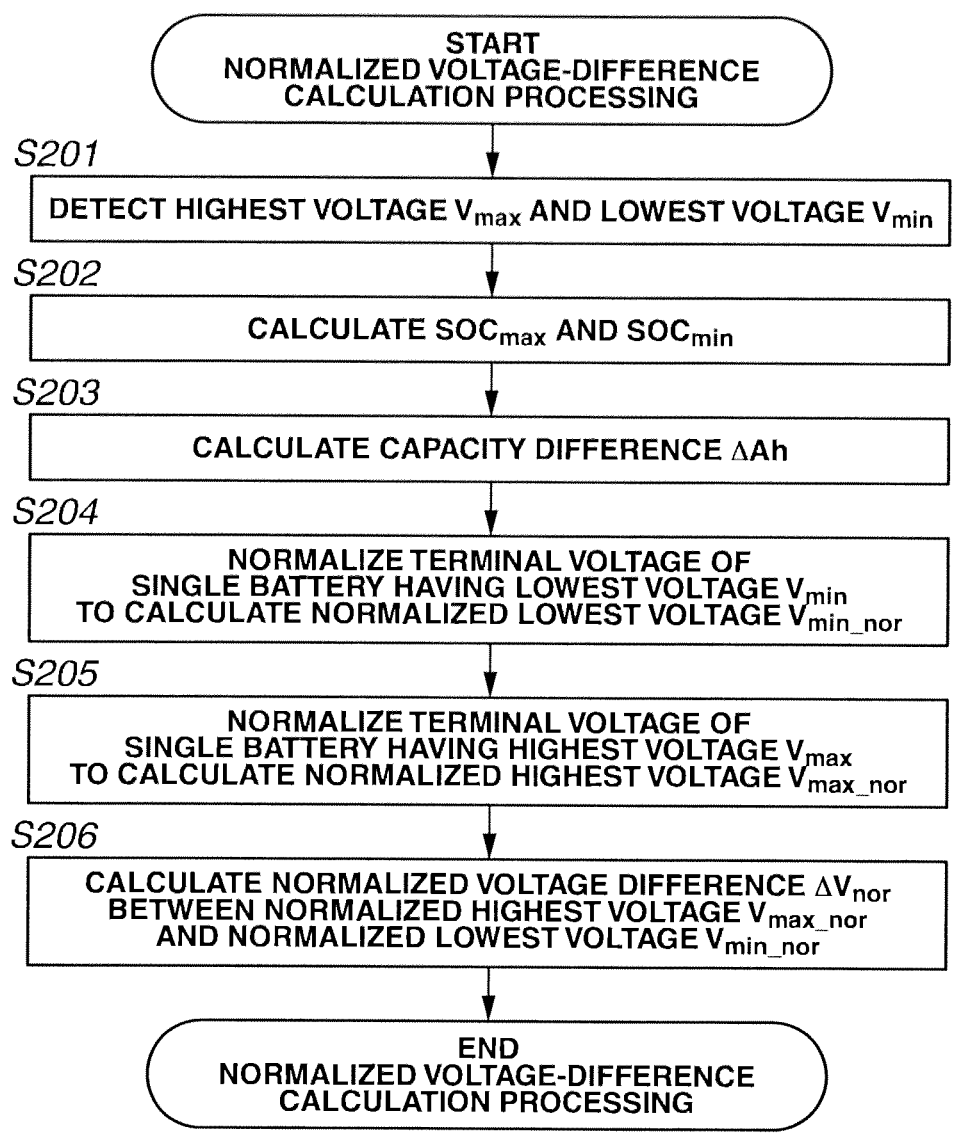
FIG. 11 is a flowchart illustrating a flow of calculation processing for a normalized voltage difference among the single batteries.

First, at step S201 shown in FIG. 11, detection processing is carried out for detecting, based on the terminal voltages of the single batteries C1, C2, . . . , CN, acquired at step S101 shown in FIG. 8, both the highest voltage $V_{max}$ of the single battery whose terminal voltage becomes the maximum value and the lowest voltage $V_{min}$ of the single battery whose terminal voltage becomes the minimum value.

At step S202, calculation processing is carried out for calculating, from the highest voltage $V_{max}$ and the lowest voltage $V_{min}$ both detected at step S201 and the battery temperature acquired at step S101, a SOC (hereinafter referred to as "$SOC_{max}$") of the single battery having the highest voltage $V_{max}$ and a SOC (hereinafter referred to as "$SOC_{min}$") of the single battery having the lowest voltage $V_{min}$, on the basis of the table of FIG. 3 stored in the SOC table storage section 510 and showing the relationship between a SOC and a terminal voltage of each single battery C1, C2, . . . , CN. By the way, the battery has a property that the relationship between a SOC and a terminal voltage of each single battery C1, C2, . . . , CN generally depends on a battery temperature. In calculating the $SOC_{max}$ and the $SOC_{min}$ in the calculation processing for the normalized voltage difference in the embodiment, the calculation processing is made on the basis of the table of FIG. 3 showing the relationship between a SOC and a terminal voltage of each single battery C1, C2, . . . , CN, fully taking account of the battery temperature acquired at step S101.

At step S203, a capacity difference $\Delta Ah$ between the single battery having the highest voltage $V_{max}$ and the single battery having the lowest voltage $V_{min}$ is calculated based on the $SOC_{max}$ and the $SOC_{min}$ both calculated at step S202. For instance, the capacity difference $\Delta Ah$ can be calculated by multiplying a battery capacity (a rated capacity or an actual capacity) of each of the single batteries C1, C2, . . . , CN constructing the assembled battery 100 with the difference between the $SOC_{max}$ and the $SOC_{min}$ both calculated at step S202.

Figure 12:
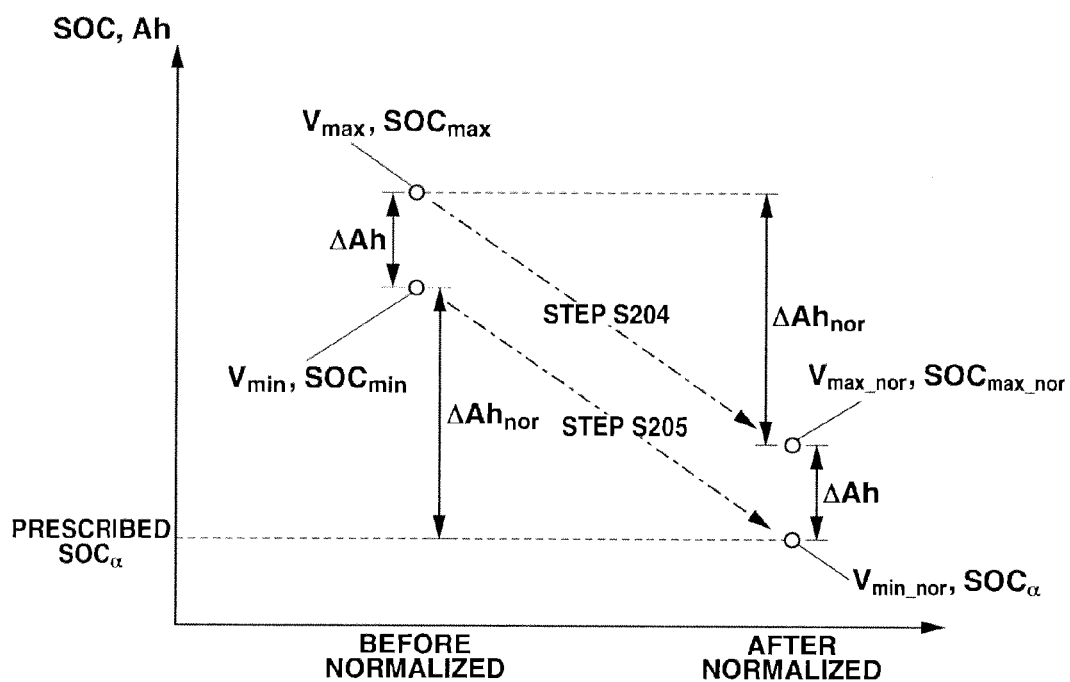
FIG. 12 is an explanatory diagram illustrating the calculation processing for the normalized voltage difference.

At step S204, a normalized capacity difference $\Delta Ah_{nor}$, corresponding to the difference capacity between the SOC of the single battery having the lowest voltage $V_{min}$ and the prescribed $SOC_\alpha$, is calculated from the SOC of the single battery having the lowest voltage $V_{min}$ and the prescribed $SOC_\alpha$, on the basis of the table of FIG. 3 showing the relationship between a SOC and a terminal voltage of each single battery C1, C2, . . . , CN. Then, a voltage (hereinafter referred to as "normalized lowest voltage $V_{min\_nor}$") of the single battery having the lowest voltage $V_{min}$ on the assumption that the SOC of the single battery having the lowest voltage $V_{min}$ is the prescribed SOC, is calculated from the normalized capacity difference $\Delta Ah_{nor}$ on the basis of the table of FIG. 3 showing the relationship between a SOC and a terminal voltage of each single battery C1, C2, . . . , CN. Referring to FIG. 12, there is shown the explanatory diagram illustrating the calculation processing for the normalized voltage difference. That is, at step S204, as shown in FIG. 12, the terminal voltage of the single battery having the lowest voltage $V_{min}$ is normalized with respect to the prescribed $SOC_\alpha$, so as to calculate the normalized lowest voltage $V_{min\_nor}$.

At step S205, on the basis of the SOC of the single battery having the highest voltage $V_{max}$ and the table of FIG. 3 showing the relationship between a SOC and a terminal voltage of each single battery C1, C2, . . . , CN, a voltage and a SOC of the single battery having the highest voltage $V_{max}$, after having subtracted the normalized capacity difference $\Delta Ah_{nor}$, calculated at step S204, from the capacity of the single battery having the highest voltage $V_{max}$, are calculated. The voltage and the SOC of the single battery having the highest voltage, calculated after the aforementioned subtraction, are hereinafter referred to as "normalized highest voltage $V_{max\_nor}$" and "normalized $SOC_{max\_nor}$", respectively. That is, at step S205, as shown in FIG. 12, the terminal voltage of the single battery having the highest voltage $V_{max}$ is normalized with respect to the normalized capacity difference $\Delta Ah_{nor}$, so as to calculate the normalized highest voltage $V_{max\_nor}$.

At step S206, a normalized voltage difference $\Delta V_{nor}$ is calculated based on the normalized lowest voltage $V_{min\_nor}$ calculated at step S204, and the normalized highest voltage $V_{max\_nor}$, calculated at step S205. Concretely, the normalized voltage difference $\Delta V_{nor}$ is calculated as a finite difference between the normalized highest voltage $V_{max\_nor}$ and the normalized lowest voltage $V_{min\_nor}$.

In this manner, calculation processing for the normalized voltage difference $\Delta V_{nor}$ among the single batteries C1, C2, . . . , CN is executed. The normalized voltage difference $\Delta V_{nor}$, calculated as discussed above, is a normalized value that the voltage difference, corresponding to the capacity difference $\Delta Ah$ between the single battery having the highest voltage $V_{max}$ and the single battery having the lowest voltage $V_{min}$, is normalized with respect to the prescribed $SOC_\alpha$. Hence, the normalized voltage difference enables comparison between data measured in different SOC regions.

Returning again to FIG. 8, at step S104, the voltage-difference data storage section 508 of the battery controller 500 executes processing for storing the normalized voltage-difference $\Delta V_{nor}$ data, calculated by the normalized voltage-difference calculation processing, in the voltage-difference data storage section 508. At this time, the normalized voltage-difference $\Delta V_{nor}$ data, together with the measurement-time data for the terminal voltage of each of the single batteries C1, C2, ..., CN, used for arithmetic calculation for the normalized voltage difference ΔV, is stored in the memory incorporated in the battery controller 500. In the second embodiment, the voltage-difference data storage section 508 is configured to store the normalized voltage-difference $\Delta V_{nor}$ data in the memory incorporated in the battery controller 500, without executing correlation processing as executed in the first embodiment for correlating with the SOC section $S_{sec}$.

At step S105, the normalized voltage-difference $\Delta V_{nor}$ data, stored in the voltage-difference data storage section 508 and calculated by the arithmetic processing executed before the previous execution cycle (arithmetic processing until now) is read out, while correlating with the measurement time.

At step S106, in the same manner as the previously-discussed step S6 of the first embodiment, by performing linear regression of the correlation of the normalized voltage-difference $\Delta V_{nor}$ data calculated by the arithmetic processing executed before the previous execution cycle, and the normalized voltage-difference $\Delta V_{nor}$ data calculated by the arithmetic processing executed by the current arithmetic processing, with the measurement times of these data, a regression line is obtained.

Then, at step S107, in the same manner as the previously-discussed step S7 of the first embodiment, a check is made to determine whether a correlation coefficient $R^2$ of the regression line is greater than or equal to the predetermined threshold value. When the correlation coefficient $R^2$ is greater than or equal to the predetermined threshold value, the routine proceeds to step S108 and thus an error flag is set to "0". Then, at step S109, in the same manner as the previously-discussed step S9 of the first embodiment, processing for predicting time when the assembled battery 100 becomes an abnormal state is performed by calculating time when the normalized voltage difference $\Delta V_{nor}$ becomes greater than or equal to the predetermined threshold value $\Delta V_\alpha$.

Conversely when step S107 determines that the correlation coefficient $R^2$ of the regression line is less than the predetermined threshold value, processing of steps S110-S119 shown in FIG. 9 is executed. The processing of steps S110-S119 shown in FIG. 9 is the same as that of steps S10-S19 of the first embodiment shown in FIG. 6. However, in the second embodiment, a single error flag can be set without setting an error flag every SOC sections $S_{sec}$ and without executing such error processing as executed every SOC sections $S_{sec}$ in the first embodiment, and also in the second embodiment such processing is executed for all voltage-difference ΔV data (regarding the error processing, each of the third and fourth embodiments described later are the same as the second embodiment). Also, after the processing of steps S110-S119 shown in FIG. 9 has terminated, the current processing terminates and thus the routine returns again to step S101.

The second embodiment has the following merits in addition to the merits of the first embodiment.

That is, in the second embodiment, when calculating a voltage difference among the single batteries C1, C2, ..., CN, a normalized voltage difference $\Delta V_{nor}$ that the SOC of each of the single batteries is normalized with respect to the prescribed $SOC_\alpha$, is calculated. Time when the assembled battery 100 becomes an abnormal state is predicted by the use of the normalized voltage difference $\Delta V_{nor}$. Hence, according to the second embodiment, it is possible to more greatly enhance the data compatibility between the voltage-difference data detected or measured in different SOC conditions, and whereby it is possible to compare the voltage-difference data with a high accuracy and thus it is possible to more precisely find a time-dependent change in voltage difference among the single batteries.

Third Embodiment

Next, the third embodiment of the invention is hereunder described.

The third embodiment is similar to the first embodiment except that, in the assembled battery system shown in FIGS. 1-2, abnormality-time prediction processing is executed by a method described below.

The abnormality-time prediction processing of the third embodiment is hereinafter described.

Figure 13:
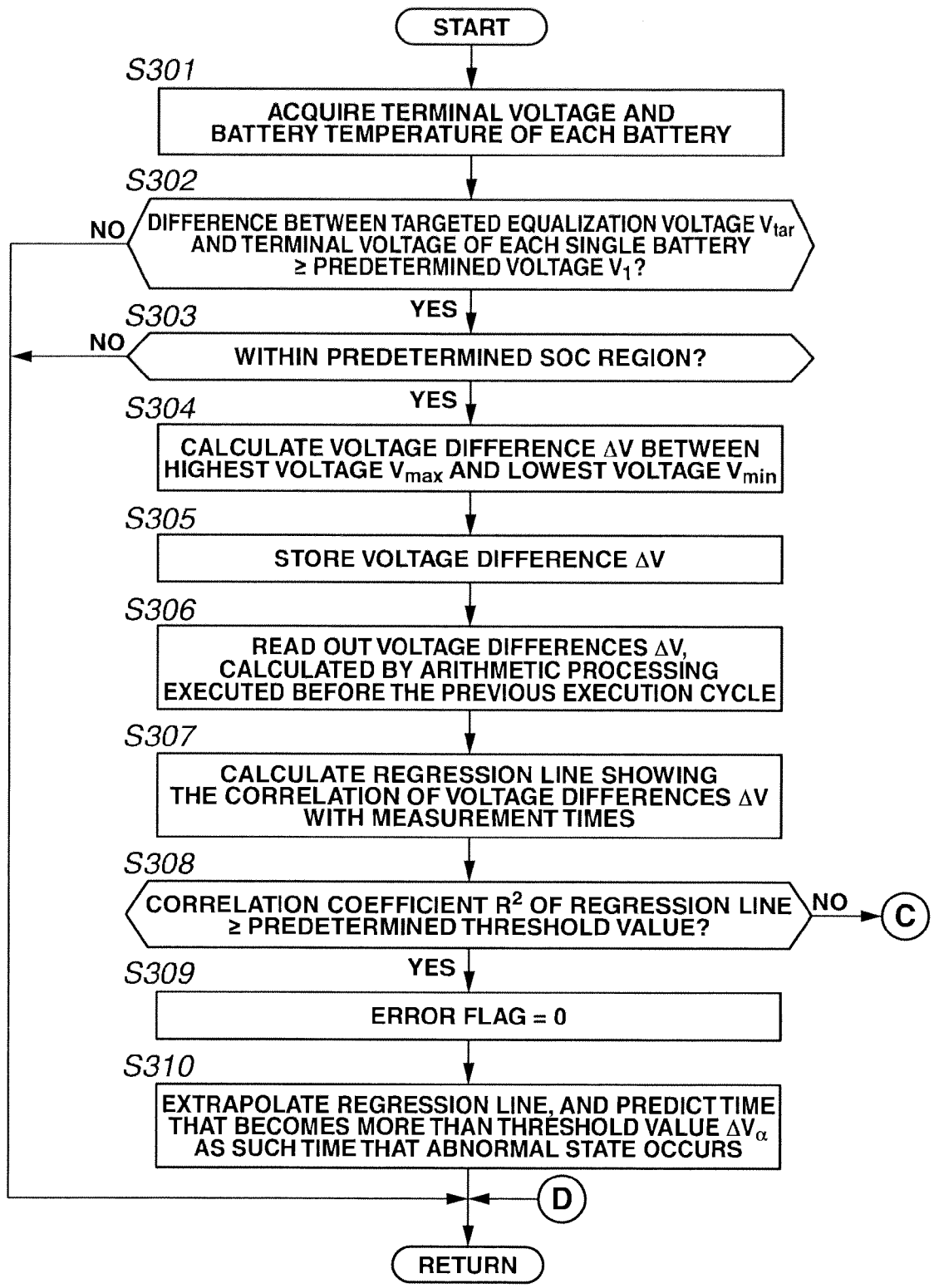
FIG. 13 is a flowchart illustrating a flow of abnormality-time prediction processing according to a third embodiment.

FIG. 13 is the flowchart illustrating the flow of the abnormality-time prediction processing of the third embodiment. The abnormality-time prediction processing, hereinafter described in detail, is initiated when turning on an ignition switch of the vehicle, on which the assembled battery system of the third embodiment is mounted, or when powering the vehicle's electrical systems by the charging-on system. The following processing is executed mainly by means of the prediction section 507 of the battery controller 500.

First, at step S301, in the same manner as the previously-discussed step S1 of the first embodiment, data acquisition for the terminal voltage of each of the single batteries C1, C2, ..., CN, and the battery temperature is executed.

Then, at step S302, in the same manner as the previously-discussed step S2 of the first embodiment, a check is made to determine whether the difference between the targeted equalization voltage $V_{tar}$ set by the control section 505 and the terminal voltage of each of the single batteries C1, C2, ..., CN is greater than or equal to the predetermined voltage $V_1$. When the difference between them is greater than or equal to the predetermined voltage $V_1$, the routine proceeds to step S303. Conversely when the difference between them is less than the predetermined voltage $V_1$, the current processing terminates and thus the routine returns again to step S301.

At step S303, a check is made to determine, based on the terminal voltage of each of the single batteries C1, C2, ..., CN, whether the SOC of each of the single batteries C1, C2, ..., CN is within a predetermined SOC region $S_r$. When the SOC of each of the single batteries is within the predetermined SOC region $S_r$, the routine proceeds to step S305. Conversely when the SOC of each of the single batteries is outside of the predetermined SOC region $S_r$, the current processing terminates and thus the routine returns again to step S301. By the way, the predetermined SOC region $S_r$ is not limited. In the shown embodiment, the predetermined SOC region $S_r$ is set to a given SOC range in SOC regions, in which a ratio of a terminal-voltage change with respect to a SOC change is large, concretely, in a SOC region near the full charge $S_{FULL}$ or in a SOC region near the discharge lower limit $S_{L\_LIM}$. Also, in the shown embodiment, when the SOC, corresponding to the targeted equalization voltage $V_{tar}$ set by the control section 505, exists in a SOC region near the full charge $S_{FULL}$, the aforementioned predetermined SOC region $S_r$ is set to a SOC region near the discharge lower limit $S_{L\_LIM}$. Conversely when the SOC, corresponding to the targeted equalization voltage $V_{tar}$ set by the control section 505, exists in a SOC region near the discharge lower limit $S_{L\_LIM}$, the aforementioned predetermined SOC region $S_r$ is set to a SOC region near the full charge $S_{FULL}$.

Then, at step S304, in the same manner as the previously-discussed step S3, the voltage difference ΔV, corresponding to a finite difference among the terminal voltages of the single batteries C1, C2, . . . , CN, is calculated.

Then, at step S305, the voltage-difference data storage section 508 of the battery controller 500 executes processing for storing the voltage-difference ΔV data, calculated at step S304, in the voltage-difference data storage section 508. At this time, the voltage-difference ΔV data, together with the measurement-time data for the terminal voltage of each of the single batteries C1, C2, . . . , CN, used for arithmetic calculation for the voltage difference ΔV, is stored in the memory incorporated in the battery controller 500. In the third embodiment, the voltage-difference data storage section 508 is configured to store the voltage-difference ΔV data in the memory incorporated in the battery controller 500, without executing correlation processing as executed in the first embodiment for correlating with the SOC section $S_{sec}$.

At step S306, the voltage-difference ΔV data, stored in the voltage-difference data storage section 508 and calculated by the arithmetic processing executed before the previous execution cycle (arithmetic processing until now) is read out, while correlating with the measurement time.

At step S307, in the same manner as the previously-discussed step S6 of the first embodiment, by performing linear regression of the correlation of the voltage-difference ΔV data calculated by the arithmetic processing executed before the previous execution cycle, and the voltage-difference ΔV data calculated by the arithmetic processing executed by the current arithmetic processing, with the measurement times of these data, a regression line is obtained.

Then, at step S308, in the same manner as the previously-discussed step S7 of the first embodiment, a check is made to determine whether a correlation coefficient $R^2$ of the regression line is greater than or equal to the predetermined threshold value. When the correlation coefficient $R^2$ is greater than or equal to the predetermined threshold value, the routine proceeds to step S309 and thus an error flag is set to "0". Then, at step S310, in the same manner as the previously-discussed step S9 of the first embodiment, processing for predicting time when the assembled battery 100 becomes an abnormal state is performed by calculating time when the voltage difference ΔV becomes greater than or equal to the predetermined threshold value $ΔV_α$.

Conversely when step S308 determines that the correlation coefficient $R^2$ of the regression line is less than the predetermined threshold value, the processing of steps S110-S119 shown in FIG. 9 as previously discussed in the second embodiment is executed. However, in the third embodiment, in steps S110-S119, the voltage difference ΔV is used instead of the normalized voltage difference $ΔV_{nor}$. Also, after the processing of steps S110-S119 shown in FIG. 9 has terminated, the current processing terminates and thus the routine proceeds to step S301.

The third embodiment has the following merits in addition to the merits of the first embodiment.

That is, in the third embodiment, when the SOC of each of single batteries is within the predetermined SOC region $S_r$, the voltage difference ΔV is calculated. Processing for predicting time when the assembled battery 100 becomes an abnormal state is executed by the use of the calculated voltage difference ΔV. Hence, it is possible to execute processing for predicting time when the assembled battery 100 becomes an abnormal state with a high accuracy, while ensuring a reduction in the number of data stored in the memory and a reduction of the operation load.

By the way, in the third embodiment, when the targeted equalization voltage $V_{tar}$ exists in a SOC region near the full charge $S_{FULL}$, the predetermined SOC region $S_r$ is set to a SOC region near the discharge lower limit $S_{L\_LIM}$. Conversely when the targeted equalization voltage $V_{tar}$ exists in a SOC region near the discharge lower limit $S_{L\_LIM}$, the predetermined SOC region $S_r$ is set to a SOC region near the full charge $S_{FULL}$. That is, the predetermined SOC region $S_r$ can be set to the SOC region opposite to the SOC region of the targeted equalization voltage $V_{tar}$. In this case, the voltage difference among the single batteries whose voltages have been equalized at the targeted equalization voltage $V_{tar}$, can be fully canceled. Hence, it is possible to remarkably enhance the accuracy of prediction in predicting time when the assembled battery 100 becomes an abnormal state, while ensuring a reduction in the number of data stored in the memory and a reduction of the operation load.

Fourth Embodiment

Next, the fourth embodiment of the invention is hereunder described.

The fourth embodiment is similar to the first embodiment except that, in the assembled battery system shown in FIGS. 1-2, abnormality-time prediction processing is executed by a method described below.

The abnormality-time prediction processing of the fourth embodiment is hereinafter described.

Figure 14:
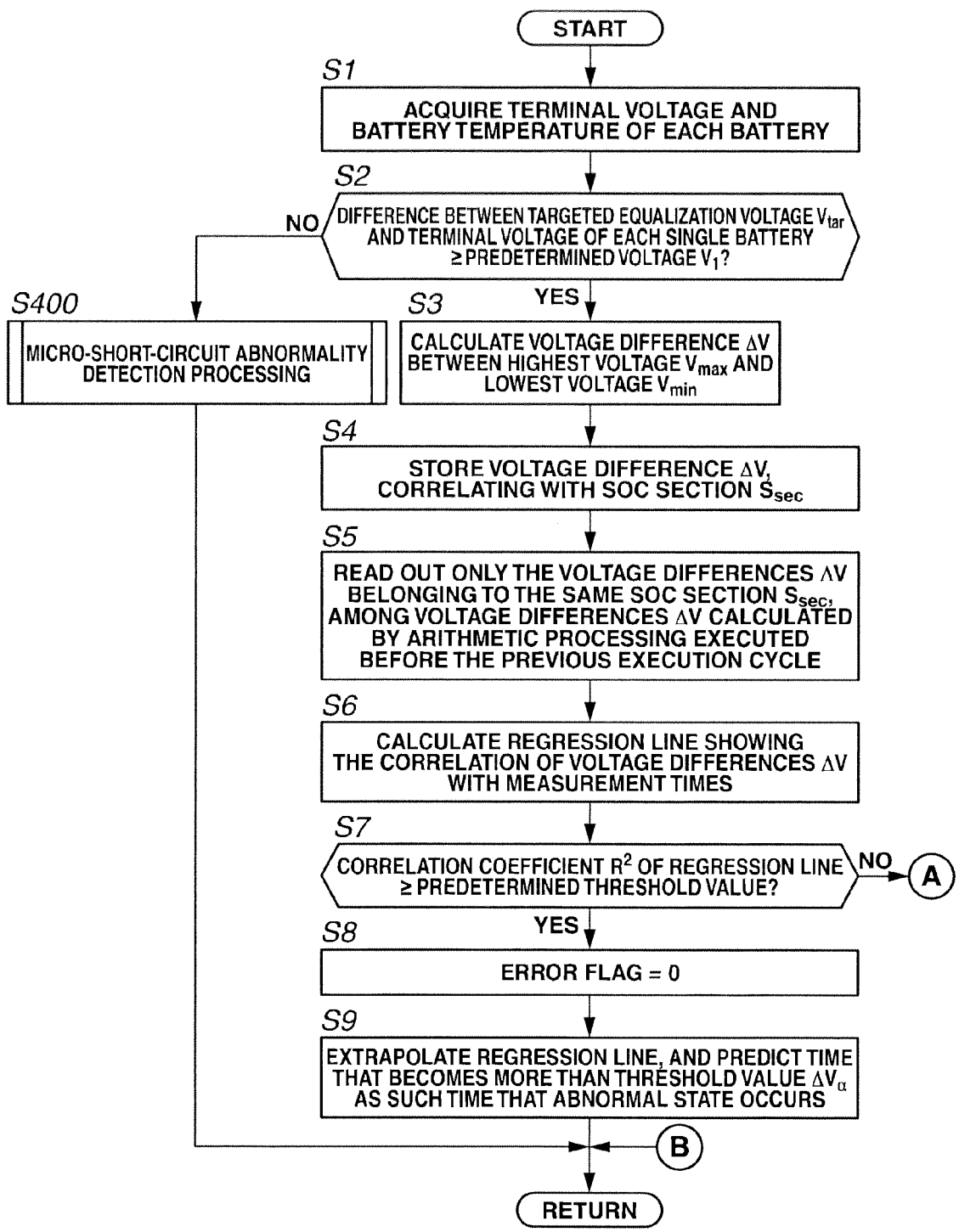
FIG. 14 is a flowchart illustrating a flow of abnormality-time prediction processing according to a fourth embodiment.

FIG. 14 is the flowchart illustrating the flow of the abnormality-time prediction processing of the fourth embodiment.

In the fourth embodiment, as shown in FIG. 14, as a result of determination on whether the difference between the targeted equalization voltage $V_{tar}$, set by the control section 505 at step S2 as previously discussed in the first embodiment, and the terminal voltage of each of the single batteries C1, C2, . . . , CN is greater than or equal to the predetermined voltage $V_1$, in the case that the previously-noted difference is less than the predetermined voltage $V_1$, the routine proceeds to step S400 at which a micro-short-circuit abnormality detection processing is executed for predicting, by virtue of detection of a micro short-circuit, time when the assembled battery becomes an abnormal state. Thus, the fourth embodiment is similar to the first embodiment except the micro-short-circuit abnormality detection processing. That is, in the fourth embodiment, as a result of determination on whether the difference between the targeted equalization voltage $V_{tar}$, set by the control section 505 at step S2, and the terminal voltage of each of the single batteries C1, C2, . . . , CN is greater than or equal to the predetermined voltage $V_1$, in the case that the previously-noted difference is greater than or equal to the predetermined voltage $V_1$, in the same manner as the previously-described first embodiment, the processing of steps S1-S9 and steps S10-S9 shown in FIG. 6 is executed.

Conversely when the difference between the targeted equalization voltage $V_{tar}$ and the terminal voltage of each of the single batteries C1, C2, . . . , CN is less than the predetermined voltage $V_1$, on the one hand, it can be determined that each of the single batteries C1, C2, . . . , CN becomes in a state where the terminal voltages of the single batteries have already been equalized at the targeted equalization voltage $V_{tar}$ (or in a state where there is a less charging/discharging action for each of the single batteries after having been equalized). Hence, in this case, it can be usually considered that the terminal voltages of the single batteries C1, C2, ..., CN become equalized. However, on the other hand, in the event that a micro shirt-circuit occurs in the single batteries, constructing the assembled battery 100, it is assumed that the terminal voltage of the single battery, which has been micro-short-circuited, becomes low, as compared to the other single batteries. For this reason, in the fourth embodiment, when the difference between the targeted equalization voltage $V_{tar}$ and the terminal voltage of each of the single batteries C1, C2, ..., CN is less than the predetermined voltage $V_1$, the micro-short-circuit abnormality detection processing (described later) is executed for predicting time when the degree of a micro short-circuit becomes large and as a result the assembled battery becomes an abnormal state.

Figure 15:
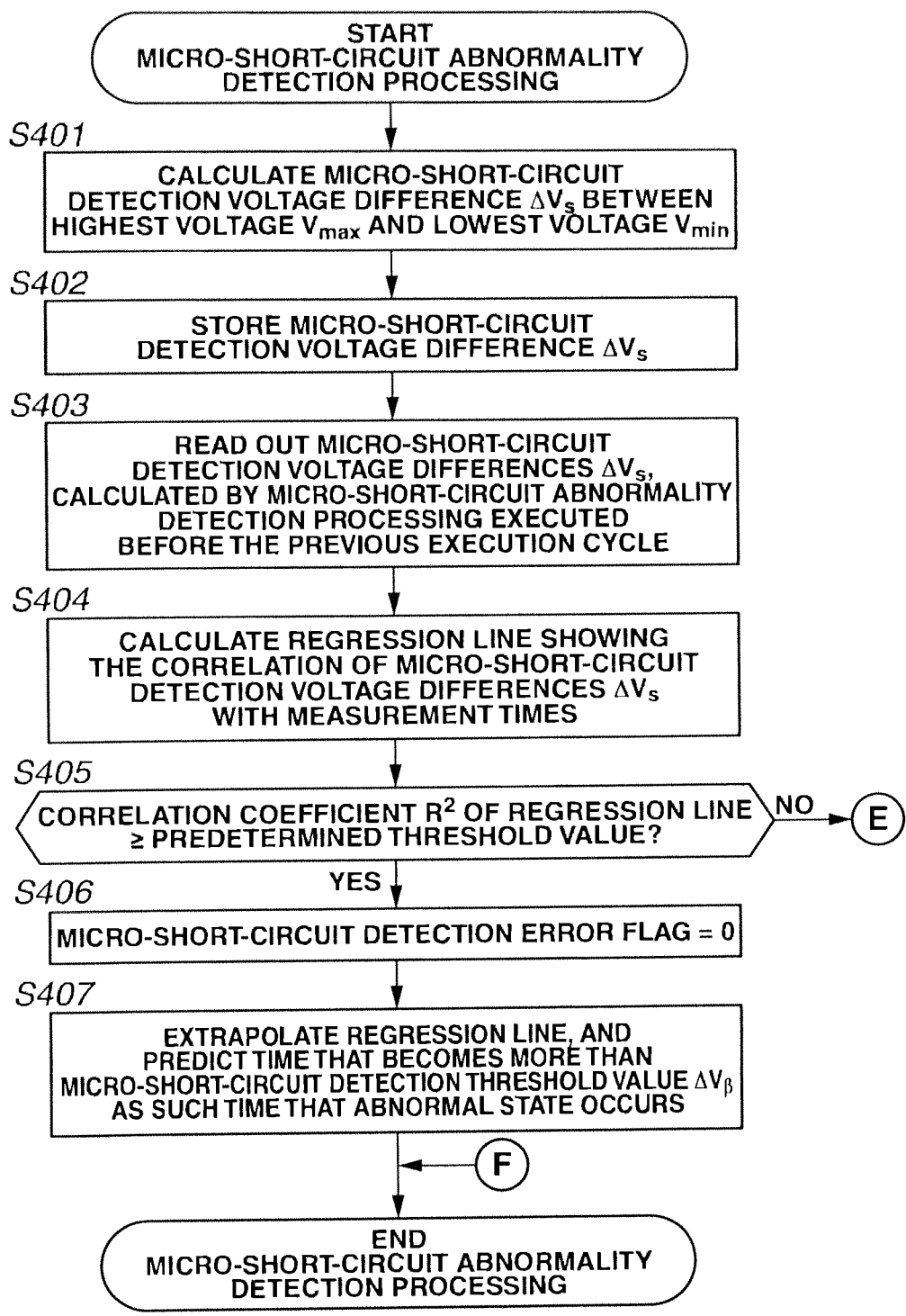
FIG. 15 is one side of a flowchart illustrating a flow of micro-short-circuit abnormality detection processing.
Figure 16:
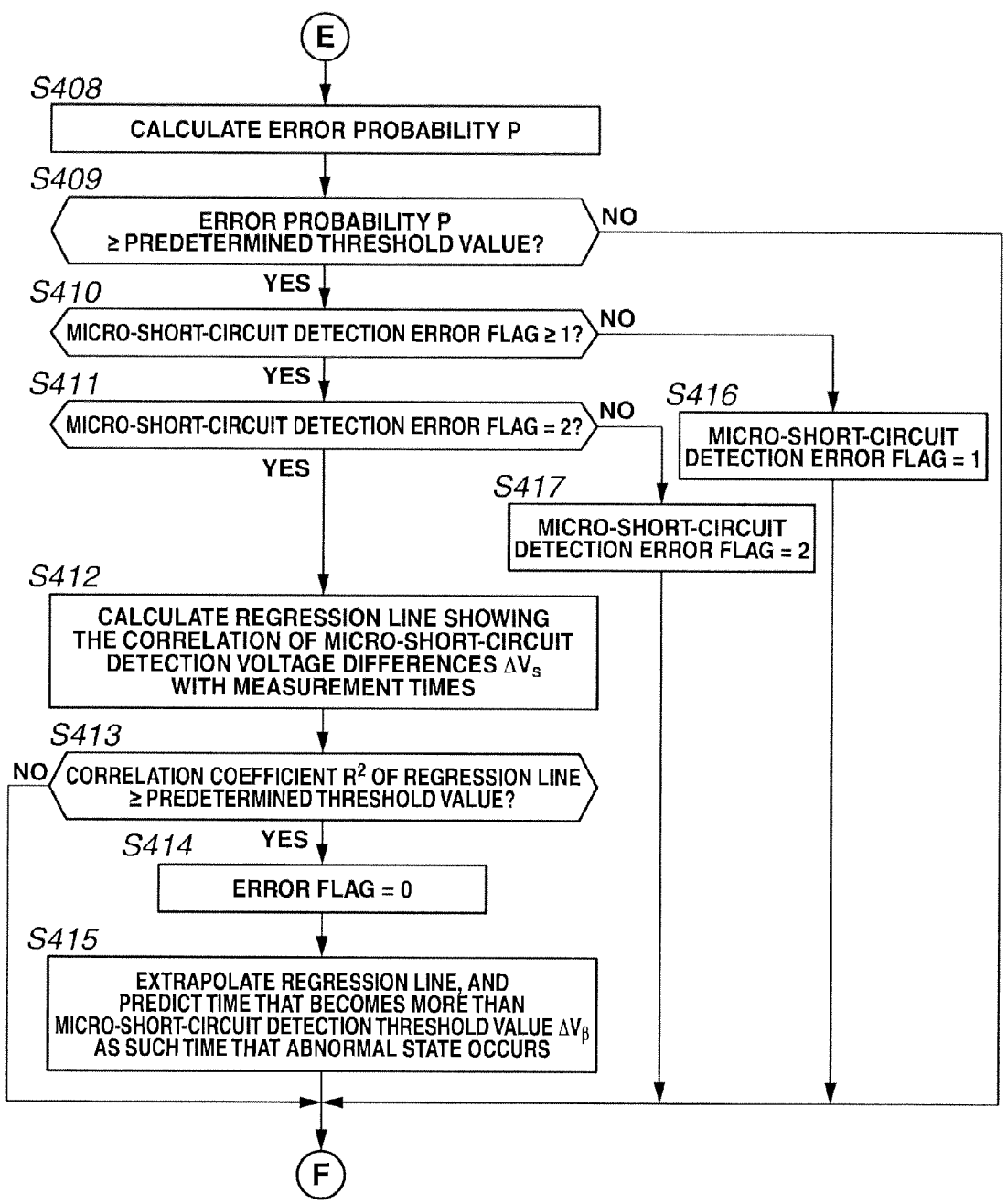
FIG. 16 is the other of the flowchart illustrating the flow of the micro-short-circuit abnormality detection processing.

The micro-shirt-circuit abnormality detection processing for predicting, by virtue of detection of a micro short-circuit, time when the assembled battery becomes an abnormal state, is hereinafter described. FIGS. 15-16 are the flowchart illustrating the flow of the micro-short-circuit abnormality detection processing.

First, at step S401 of FIG. 15, in the same manner as the previously-discussed step S3 of the first embodiment, a micro-short-circuit detection voltage difference ΔV, is arithmetically calculated by calculating a finite difference among the terminal voltages of the single batteries C1, C2, ..., CN.

Then, at step S402, the voltage-difference data storage section 508 of the battery controller 500 executes processing for storing the micro-short-circuit detection voltage-difference $\Delta V_s$ data, calculated at step S401, in the voltage-difference data storage section 508. At this time, the micro-short-circuit detection voltage-difference $\Delta V_s$ data, together with the measurement-time data for the terminal voltage of each of the single batteries C1, C2, ..., CN, used for arithmetic calculation for the micro-short-circuit detection voltage difference $\Delta V_s$, is stored in the memory incorporated in the battery controller 500. In the micro-short-circuit abnormality detection processing, the micro-short-circuit detection voltage-difference $\Delta V_s$ data is stored in the memory incorporated in the battery controller 500, without executing correlation processing for correlating with the SOC section $S_{sec}$.

At step S403, the micro-short-circuit detection voltage-difference $\Delta V_s$ data, stored in the voltage-difference data storage section 508 and calculated by the arithmetic processing executed before the previous execution cycle is read out, while correlating with the measurement time.

At step S404, in the same manner as the previously-discussed step S6 of the first embodiment, by performing linear regression of the correlation of the micro-short-circuit detection voltage-difference $\Delta V_s$ data calculated by the arithmetic processing executed before the previous execution cycle, and the micro-short-circuit detection voltage-difference $\Delta V_s$ data calculated by the arithmetic processing executed by the current arithmetic processing, with the measurement times of these data, a regression line is obtained.

Then, at step S405, in the same manner as the previously-discussed step S7 of the first embodiment, a check is made to determine whether a correlation coefficient $R^2$ of the regression line is greater than or equal to the predetermined threshold value. When the correlation coefficient $R^2$ is greater than or equal to the predetermined threshold value, the routine proceeds to step S406 and thus a micro-short-circuit detection error flag is set to "0". Then, the routine proceeds to step S407.

At step S407, on the basis of the regression line obtained at step S404, processing for predicting time when the degree of a micro short-circuit becomes large and as a result the assembled battery becomes an abnormal state is executed. Concretely, extrapolation processing for the regression line, obtained at step S404, is executed. Time when the micro-short-circuit detection voltage difference $\Delta V_s$ becomes greater than or equal to a predetermined micro-short-circuit detection threshold value $\Delta V_\beta$ is calculated from the extrapolated regression line. The calculated time is set as the time when the degree of a micro short-circuit becomes large and as a result the assembled battery becomes an abnormal state. By the way, in the embodiment, the aforementioned threshold value $\Delta V_\beta$ can be set to an arbitrary value at which it can be determined that the degree of a micro short-circuit becomes large and as a result the assembled battery becomes an abnormal state, for example, the same value as the threshold value $\Delta V_\alpha$ or an arbitrary value different from the threshold value $\Delta V_\alpha$. Information about the time when the degree of a micro short-circuit becomes large and as a result the assembled battery becomes an abnormal state, which time is predicted or obtained in this way, is sent from the prediction section 507 to the communication section 510. Then, the information is sent via the communication section 510 to the wireless communication terminal such as a cellular phone that the user has, or the on-vehicle equipment installed on the vehicle, for supplying the information via the wireless communication terminal or the on-vehicle equipment to the user. Then, the micro-short-circuit abnormality detection processing terminates and thus the routine returns again to step S1.

Conversely when step S405 determines that the correlation coefficient $R^2$ of the regression line is less than the predetermined threshold value, processing of steps S408-S417 shown in FIG. 16 is executed. The processing of steps S408-S417 shown in FIG. 16 is similar to that of steps S110-S119 of the second embodiment shown in FIG. 9, except that, in steps S110-S119 of the second embodiment shown in FIG. 9, the micro-short-circuit detection voltage difference $\Delta V_s$ is used instead of the normalized voltage difference $\Delta V_{nor}$, and the micro-short-circuit detection error flag is used instead of the error flag. Also, after the processing of steps S408-S417 shown in FIG. 16 has terminated, the micro-short-circuit abnormality detection processing terminates and thus the routine returns again to step S1.

The fourth embodiment has the following merits in addition to the merits of the first embodiment.

That is, when the difference between the targeted equalization voltage $V_{tar}$ and the terminal voltage of each of the single batteries C1, C2, ..., CN is less than the predetermined voltage $V_1$, a micro-short-circuit detection voltage difference $\Delta V_s$ is calculated. It is possible to appropriately predict time when the degree of a micro short-circuit becomes large and as a result the assembled battery becomes an abnormal state, different from an abnormal state being predictable in the first embodiment (for instance, a state where use restrictions are required due to a battery capacity fall in one or two or more batteries of the single batteries constructing the assembled battery 100), by the use of the calculated micro-short-circuit detection voltage difference $\Delta V_s$.

By the way, in the previously-discussed processing exemplified by the fourth embodiment, the micro-short-circuit abnormality detection processing is executed when the difference between the targeted equalization voltage $V_{tar}$ and the terminal voltage of each of the single batteries C1, C2, ..., CN is less than the predetermined voltage $V_1$.

Execution of micro-short-circuit abnormality detection processing is not limited to the fourth embodiment described herein. As a matter of course, such micro-short-circuit abnormality detection processing may be executed in the second and third embodiments. In such a modified case, the same operation and effects can be provided.

By the way, in the previously-described embodiments, the prediction section 507 corresponds to an internal state detection means and a prediction means of the invention. The voltage-difference data storage section 508 corresponds to a time-series data storage means of the invention. The capacity adjustment section 504 and the control section 505 correspond to a capacity adjustment means of the invention. The control section 505 also corresponds to a targeted voltage setting means. The SOC table storage section 510 corresponds to a SOC-voltage table storage means of the invention.

While the foregoing is a description of the embodiments carried out the invention, it will be understood that these embodiments are described for easy understanding of the invention and thus the invention is not limited to the particular embodiments shown and described herein, but that various design changes and modifications and equivalents, belonging to the scope or spirit of this invention may be included.

For instance, the previously-described embodiments are exemplified by prediction processing for predicting, based on a time-dependent change in voltage difference among the single batteries, time when the assembled battery 100 becomes an abnormal state. Instead of using a time-dependent change in the voltage difference, the system may be configured to predict, based on a time-dependent change in the SOC difference among the single batteries, a time-dependent change in the capacity difference among the single batteries, or a time-dependent change in the internal-resistance difference among the single batteries, time when the assembled battery 100 becomes an abnormal state. In particular, there is a specified correlation between a voltage difference and a SOC difference among the single batteries. For this reason, in the previously-described embodiments, when using a SOC difference instead of a voltage difference among the single batteries, almost the same system configuration can be adopted and hence it is very preferable.

Furthermore, in the previously-described embodiments, when the difference between the targeted equalization voltage $V_{tar}$ and the terminal voltage of each of the single batteries C1, C2, . . . , CN is greater than or equal to (or less than) the predetermined voltage $V_1$, the voltage difference $\Delta V$ (or the micro-short-circuit detection voltage difference $\Delta V_s$) is calculated. The system configuration is exemplified by prediction processing for predicting, based on this calculation result, time when the assembled battery 100 becomes an abnormal state. In lieu thereof, when the difference between the SOC corresponding to the targeted equalization voltage $V_{tar}$ and the SOC of each of the single batteries C1, C2, . . . , CN is greater than or equal to (or less than) a predetermined value, the voltage difference $\Delta V$ (or the micro-short-circuit detection voltage difference $\Delta V_s$) may be calculated, and then prediction processing may be executed for predicting, based on this calculation result, time when the assembled battery 100 becomes an abnormal state. Moreover, instead of directly comparing the targeted equalization voltage $V_{tar}$ with the terminal voltage of each of the single batteries, when the time, elapsed from a point of time when each of the single batteries has been equalized at the targeted equalization voltage $V_{tar}$, becomes longer than or equal to (or shorter than) a predetermined time, it may be determined that the difference between the targeted voltage $V_{tar}$ and the terminal voltage of each of the single batteries C1, C2, . . . , CN has been greater than or equal to (or less than) the predetermined voltage $V_1$, and thus the voltage difference $\Delta V$ (or the micro-short-circuit detection voltage difference $\Delta V_s$) may be calculated, and then prediction processing may be executed for predicting, based on this calculation result, time when the assembled battery 100 becomes an abnormal state.

Furthermore, in predicting time when the assembled battery 100 becomes an abnormal state, the system may be configured as follows. That is, time-series voltage-difference data of other assembled batteries except the assembled battery 100 are acquired, and then processing for predicting time when the assembled battery 100 becomes an abnormal state is performed by reference to the time-series voltage-difference data of the other assembled batteries. In particular, by adopting such a system configuration, it is possible to collect statistical much information. Additionally, by the utilization of the information about the states of these other assembled batteries, an abnormal degree of the controlled assembled battery can be determined in advance, adequately taking account of the whole battery-state tendency including the current states of the other assembled batteries as well as the controlled assembled battery. Additionally, it is possible to predict time when the assembled battery 100 becomes an abnormal state with a high accuracy.

Also, in the exemplified system configurations of the previously-described embodiments, another regression line is newly calculated in the case that the consecutive voltage-difference data for three points or more, whose error probabilities P become greater than or equal to the predetermined threshold value, have been acquired. The condition for calculating another regression line is not limited to such a condition that the consecutive voltage-difference data for three points or more, whose error probabilities P become greater than or equal to the predetermined threshold value, have been acquired. For instance, the system may be configured such that another regression line is newly calculated when the consecutive voltage-difference data for four points or more, whose error probabilities P become greater than or equal to the predetermined threshold value, have been acquired or when the more consecutive voltage-difference data, whose error probabilities become greater than or equal to the predetermined threshold value, have been acquired.

Also, in the exemplified system configurations of the previously-described embodiments, the abnormality-time prediction processing is executed within the battery controller 500. In lieu thereof, the system may be configured such that the previously-discussed abnormality-time prediction processing is executed by means of an external abnormality detection device. In this case, the external abnormality detection device may be configured to acquire the terminal voltage of each of the single batteries constructing the assembled battery 100 from the battery controller 500 via a wireless communication terminal such as a cellular phone that the user of the assembled battery 100 has, an on-vehicle equipment installed on the vehicle, or a networked charging equipment. Thereafter, the abnormality detection device detects, based on the acquired terminal-voltage information, a voltage difference among the single batteries under a prescribed condition, and executes processing for predicting, based on the detected voltage-difference data, time when the assembled battery 100 becomes an abnormal state, according to the method as discussed previously. Then, in such a system configuration, the prediction result is sent to the cellular phone that the user of the assembled battery 100 has, or the on-vehicle equipment installed on the vehicle.

The invention claimed is:

1. A device for controlling an assembled battery system having an assembled battery provided with a plurality of single batteries, comprising:
   the assembled battery;
   a targeted voltage setting means for setting a targeted voltage to equalize voltages of the plurality of single batteries constructing the assembled battery;
   a capacity adjustment means for adjusting a capacity such that the voltages of the plurality of single batteries constructing the assembled battery are equalized at the targeted voltage;
   an internal state detection means for detecting terminal voltages or SOC of the plurality of single batteries and for detecting, based on the detected terminal voltages or the detected SOC, a voltage difference or a SOC difference among the plurality of single batteries as voltage-difference data or SOC-difference data;
   a time-series data storage means for storing the voltage-difference data or the SOC-difference data, detected by the internal state detection means, in time-series; and
   a prediction means for predicting, prior to an occurrence of a first abnormal state of the assembled battery, time when the first abnormal state occurs, based on (a) a time-dependent change in the voltage-difference data detected in a voltage region different from the targeted voltage by a predetermined voltage or more, or (b) a time-dependent change in the SOC-difference data detected in a SOC region corresponding to voltage region different from a targeted voltage by the predetermined voltage or more, among the voltage-difference data or the SOC-difference data stored in the time-series data storage means.

2. The device for controlling the assembled battery system as claimed in claim 1, wherein:
   the time-series data storage means has a SOC-section table that a SOC range of the single battery from a full charge to a discharge lower limit is classified into a plurality of SOC sections;
   the time-series data storage means stores the voltage-difference data or the SOC-difference data detected by the internal state detection means in time-series, while correlating the detected voltage-difference data or the detected SOC-difference data with the SOC section corresponding to the SOC when having detected, based on the SOC-section table, the voltage-difference data or the SOC-difference data; and
   the prediction means predicts the time when the assembled battery becomes the first abnormal state, based on the time-dependent change in the voltage-difference data or the SOC-difference data belonging to a same SOC section, among the voltage-difference data or the SOC-difference data.

3. The device for controlling the assembled battery system as claimed in claim 2, wherein:
   each of the plurality of SOC sections is set to narrow a SOC range, as a ratio of a voltage change with respect to a SOC change increases.

4. The device for controlling the assembled battery system as claimed in claim 3, wherein:
   the prediction means predicts the time when the assembled battery becomes the first abnormal state, based on the time-dependent change in the voltage-difference data or the SOC-difference data belonging to the same SOC section, among the voltage-difference data or the SOC-difference data belonging to the SOC section whose SOC range is less than or equal to a predetermined range.

5. The device for controlling the assembled battery system as claimed in claim 4, wherein:
   the prediction means predicts the time when the assembled battery becomes the first abnormal state, based on the time-dependent change in the voltage-difference data or the SOC-difference data belonging to the same SOC section, among the voltage-difference data or the SOC-difference data belonging to the SOC section whose SOC range is less than or equal to the predetermined range and which SOC section has the ratio of the voltage change with respect to the SOC change, which ratio is different from that of the SOC section to which the SOC corresponding to the targeted voltage belongs.

6. The device for controlling the assembled battery system as claimed in claim 1, which further comprises:
   a SOC-voltage table storage means for storing a table showing a relationship between the SOC and the terminal voltage of each of the plurality of single batteries,
   wherein the internal state detection means calculates normalized terminal voltages by normalizing the SOC of each of the single batteries of the plurality of single batteries, subjected to detection, with respect to a prescribed SOC, using the table stored in the SOC-voltage table storage means when detecting the voltage-difference data, and then detects the voltage-difference data based on the normalized terminal voltages.

7. The device for controlling the assembled battery system as claimed in claim 6, wherein:
   the prescribed SOC for normalization is a given SOC in a SOC region in which a ratio of a voltage change with respect to a SOC change is greater than or equal to a predetermined value.

8. The device for controlling the assembled battery system as claimed in claim 7, wherein:
   the prescribed SOC for normalization is a given SOC in a SOC region in which the ratio of the voltage change with respect to the SOC change is greater than or equal to the predetermined value and which has the ratio different from the ratio of the voltage change with respect to the SOC change in the SOC region corresponding to the targeted voltage.

9. The device for controlling the assembled battery system as claimed in claim 1, wherein:
   the internal state detection means detects the voltage-difference data or the SOC-difference data in a SOC region in which a ratio of a voltage change with respect to a SOC change is greater than or equal to a predetermined value and which has the ratio different from the ratio of the voltage change with respect to the SOC change in the SOC region corresponding to the targeted voltage or in the voltage region corresponding to the SOC region.

10. The device for controlling the assembled battery system as claimed in claim 1, wherein:
    the prediction means predicts time when the assembled battery becomes a second abnormal state different from the first abnormal state, based on the time-dependent change in the voltage-difference data or the SOC-difference data detected in a voltage region in which a deviation of the terminal voltage with respect to the targeted voltage is less than the predetermined voltage or in a SOC region corresponding to the voltage region.

11. The device for controlling the assembled battery system as claimed in claim 1, wherein:
the prediction means obtains a regression line by performing linear regression of the time-dependent change in the voltage-difference data or the SOC-difference data stored in the time-series data storage means, and predicts the time when the assembled battery becomes the first abnormal state, based on the obtained regression line.

12. The device for controlling the assembled battery system as claimed in claim 10, wherein:
the prediction means obtains a regression line by performing linear regression of the time-dependent change in the voltage-difference data or the SOC-difference data stored in the time-series data storage means, and predicts the time when the assembled battery becomes the second abnormal state, based on the obtained regression line.

13. The device for controlling the assembled battery system as claimed in claim 12, wherein:
the prediction means determines a reliability of the regression line, and calculates, based on the regression line, time when the voltage difference or the SOC difference among the plurality of single batteries becomes greater than or equal to a predetermined threshold value when the reliability of the regression line is greater than or equal to a predetermined value, and then predicts the time that becomes more than the predetermined threshold value as the time when the assembled battery becomes the first abnormal state or the second abnormal state.

14. The device for controlling the assembled battery system as claimed in claim 13, wherein:
the prediction means determines whether the voltage-difference data or the SOC-difference data, deviating from a distribution of the other voltage-difference data or the other SOC-difference data by a predetermined value among the voltage-difference data or the SOC-difference data stored in the time-series data storage means, have been detected more than a predetermined number, when the reliability of the regression line is less than the predetermined value, and obtains a new regression line by performing linear regression of the time-dependent change in the voltage-difference data or the SOC-difference data, when the voltage-difference data or the SOC-difference data, deviating from the distribution of the other voltage-difference data or the other SOC-difference data by the predetermined value; and
the prediction means determines the reliability of the obtained new regression line, and calculates, based on the new regression line, time when the voltage difference or the SOC difference among the plurality of single batteries becomes greater than or equal to a predetermined threshold value when the reliability of the new regression line is greater than or equal to a predetermined value, and then predicts the time that becomes more than the predetermined threshold value as the time when the assembled battery becomes the first abnormal state or the second abnormal state.

15. The device for controlling the assembled battery system as claimed in claim 1, which further comprises:
a data-acquisition means for acquiring voltage-difference data or SOC-difference data among a plurality of single batteries of other assembled batteries different from the controlled assembled battery subjected to control of the control device,
wherein, in predicting the time when the controlled assembled battery becomes the abnormal state, the prediction means predicts by reference to the voltage-difference data or the SOC-difference data of the other assembled batteries, acquired by the data-acquisition means, and simultaneously determines an abnormal degree of the controlled assembled battery in advance, taking account of a whole battery-state tendency including current states of the other assembled batteries as well as the controlled assembled battery.

16. The device for controlling the assembled battery system as claimed in claim 1, which further comprises;
an information means for informing a user of information about the time when the assembled battery becomes the abnormal state, predicted by the prediction means, via a wireless communication terminal or an on-vehicle equipment.

17. A device for controlling an assembled battery system having an assembled battery provided with a plurality of single batteries, comprising:
the assembled battery;
a targeted voltage setting section configured to set a targeted voltage to equalize voltages of the plurality of single batteries constructing the assembled battery;
a capacity adjustment section configured to adjust a capacity such that the voltages of the plurality of single batteries constructing the assembled battery are equalized at the targeted voltage;
an internal state detector configured to detect terminal voltages or SOC of the plurality of single batteries and to detect, based on the detected terminal voltages or the detected SOC, a voltage difference or a SOC difference among the plurality of single batteries as voltage-difference data or SOC-difference data;
a time-series data storage memory configured to store the voltage-difference data or the SOC-difference data, detected by the internal state detector in time-series; and
a prediction section configured to predict, prior to an occurrence of a first abnormal state of the assembled battery, time when the first abnormal state occurs, based on (a) a time-dependent change in the voltage-difference data detected in a voltage region different from the targeted voltage by a predetermined a SOC region corresponding to a voltage region different from a targeted voltage by the predetermined voltage or more, among the voltage-difference data or the SOC-difference data stored in the time-series data storage memory.

18. The device for controlling the assembled battery system as claimed in claim 17, wherein:
the time-series data storage memory has a SOC-section table that a SOC range of the single battery from a full charge to a discharge lower limit is classified into a plurality of SOC sections;
the time-series data storage memory stores the voltage-difference data or the SOC-difference data detected by the internal state detector in time-series, while correlating the detected voltage-difference data or the detected SOC-difference data with the SOC section corresponding to the SOC when having detected, based on the SOC-section table, the voltage-difference data or the SOC-difference data; and
the prediction section predicts the time when the assembled battery becomes the first abnormal state, based on the time-dependent change in the voltage-difference data or the SOC-difference data belonging to a same SOC section, among the voltage-difference data or the SOC-difference data.

19. The device for controlling the assembled battery system as claimed in claim 18, wherein:
    each of the plurality of SOC sections is set to narrow a SOC range, as a ratio of a voltage change with respect to a SOC change increases.

20. The device for controlling the assembled battery system as claimed in claim 19, wherein:
    the prediction section predicts the time when the assembled battery becomes the first abnormal state, based on the time-dependent change in the voltage-difference data or the SOC-difference data belonging to the same SOC section, among the voltage-difference data or the SOC-difference data belonging to the SOC section whose SOC range is less than or equal to a predetermined range.

21. The device for controlling the assembled battery system as claimed in claim 20, wherein:
    the prediction section predicts the time when the assembled battery becomes the first abnormal state, based on the time-dependent change in the voltage-difference data or the SOC-difference data belonging to the same SOC section, among the voltage-difference data or the SOC-difference data belonging to the SOC section whose SOC range is less than or equal to the predetermined range and which SOC section has the ratio of the voltage change with respect to the SOC change, which ratio is different from that of the SOC section to which the SOC corresponding to the targeted voltage belongs.

22. The device for controlling the assembled battery system as claimed in claim 17, which further comprises:
    a SOC-voltage table storage memory configured to store a table showing a relationship between the SOC and the terminal voltage of each of the plurality of single batteries,
    wherein the internal state detector calculates normalized terminal voltages by normalizing the SOC of each of the single batteries of the plurality of single batteries, subjected to detection, with respect to a prescribed SOC, using the table stored in the SOC-voltage table storage memory when detecting the voltage-difference data, and then detects the voltage-difference data based on the normalized terminal voltages.

23. The device for controlling the assembled battery system as claimed in claim 22, wherein:
    the prescribed SOC for normalization is a given SOC in a SOC region in which a ratio of a voltage change with respect to a SOC change is greater than or equal to a predetermined value.

24. The device for controlling the assembled battery system as claimed in claim 23, wherein:
    the prescribed SOC for normalization is a given SOC in a SOC region in which the ratio of the voltage change with respect to the SOC change is greater than or equal to the predetermined value and which has the ratio different from the ratio of the voltage change with respect to the SOC change in the SOC region corresponding to the targeted voltage.

25. The device for controlling the assembled battery system as claimed in claim 17, wherein:
    the internal state detector detects the voltage-difference data or the SOC-difference data in a SOC region in which a ratio of a voltage change with respect to a SOC change is greater than or equal to a predetermined value and which has the ratio different from the ratio of the voltage change with respect to the SOC change in the SOC region corresponding to the targeted voltage or in the voltage region corresponding to the SOC region.

26. The device for controlling the assembled battery system as claimed in claim 17, wherein:
    the prediction section predicts time when the assembled battery becomes a second abnormal state different from the first abnormal state, based on the time-dependent change in the voltage-difference data or the SOC-difference data detected in a voltage region in which a deviation of the terminal voltage with respect to the targeted voltage is less than the predetermined voltage or in a SOC region corresponding to the voltage region.

27. The device for controlling the assembled battery system as claimed in claim 17, wherein:
    the prediction section obtains a regression line by performing linear regression of the time-dependent change in the voltage-difference data or the SOC-difference data stored in the time-series data storage memory, and predicts the time when the assembled battery becomes the first abnormal state, based on the obtained regression line.

28. The device for controlling the assembled battery system as claimed in claim 26, wherein:
    the prediction section obtains a regression line by performing linear regression of the time-dependent change in the voltage-difference data or the SOC-difference data stored in the time-series data storage memory, and predicts the time when the assembled battery becomes the second abnormal state, based on the obtained regression line.

29. The device for controlling the assembled battery system as claimed in claim 28, wherein:
    the prediction section determines a reliability of the regression line, and calculates, based on the regression line, time when the voltage difference or the SOC difference among the plurality of single batteries becomes greater than or equal to a predetermined threshold value when the reliability of the regression line is greater than or equal to a predetermined value, and then predicts the time that becomes more than the predetermined threshold value as the time when the assembled battery becomes the first abnormal state or the second abnormal state.

30. The device for controlling the assembled battery system as claimed in claim 29, wherein:
    the prediction section determines whether the voltage-difference data or the SOC-difference data, deviating from a distribution of the other voltage-difference data or the other SOC-difference data by a predetermined value among the voltage-difference data or the SOC-difference data stored in the time-series data storage memory, have been detected more than a predetermined number, when the reliability of the regression line is less than the predetermined value, and obtains a new regression line by performing linear regression of the time-dependent change in the voltage-difference data or the SOC-difference data, when the voltage-difference data or the SOC-difference data, deviating from the distribution of the other voltage-difference data or the other SOC-difference data by the predetermined value; and
    the prediction section determines the reliability of the obtained new regression line, and calculates, based on the new regression line, time when the voltage difference or the SOC difference among the plurality of single batteries becomes greater than or equal to a predetermined threshold value when the reliability of the new regression line is greater than or equal to a predetermined value, and then predicts the time that becomes more than the predetermined threshold value as the time when the assembled battery becomes the first abnormal state or the second abnormal state.

31. The device for controlling the assembled battery system as claimed in claim 17, which further comprises:
- a data-acquisition section configured to acquire voltage-difference data or SOC-difference data among a plurality of single batteries of other assembled batteries different from the controlled assembled battery subjected to control of the control device,
- wherein, in predicting the time when the controlled assembled battery becomes the abnormal state, the prediction section predicts by reference to the voltage-difference data or the SOC-difference data of the other assembled batteries, acquired by the data-acquisition section, and simultaneously determines an abnormal degree of the controlled assembled battery in advance, taking account of a whole battery-state tendency including current states of the other assembled batteries as well as the controlled assembled battery.

32. The device for controlling the assembled battery system as claimed in claim 17, which further comprises:
- an information section configured to inform a user of information about the time when the assembled battery becomes the abnormal state, predicted by the prediction section, via a wireless communication terminal or an on-vehicle equipment.

* * * * *